(12) United States Patent
Kasuga et al.

(10) Patent No.: US 10,292,265 B2
(45) Date of Patent: May 14, 2019

(54) SUBSTRATE FOR PRINTED CIRCUIT BOARD, PRINTED CIRCUIT BOARD, AND METHOD FOR PRODUCING SUBSTRATE FOR PRINTED CIRCUIT BOARD

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Takashi Kasuga, Osaka (JP); Yoshio Oka, Osaka (JP); Shigeaki Uemura, Osaka (JP); Shigeyoshi Nakayama, Osaka (JP); Jinjoo Park, Shiga (JP); Sumito Uehara, Shiga (JP); Hiroshi Ueda, Shiga (JP); Kousuke Miura, Shiga (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 54 days.

(21) Appl. No.: 15/505,619

(22) PCT Filed: Sep. 8, 2015

(86) PCT No.: PCT/JP2015/075408
§ 371 (c)(1),
(2) Date: Feb. 22, 2017

(87) PCT Pub. No.: WO2016/039314
PCT Pub. Date: Mar. 17, 2016

(65) Prior Publication Data
US 2017/0290150 A1 Oct. 5, 2017

(30) Foreign Application Priority Data

Sep. 9, 2014 (JP) ................................. 2014-183581
Dec. 22, 2014 (JP) ................................. 2014-259475

(51) Int. Cl.
*B21D 39/00* (2006.01)
*H05K 1/09* (2006.01)
(Continued)

(52) U.S. Cl.
CPC ............. *H05K 1/092* (2013.01); *B22F 7/064* (2013.01); *C09D 11/037* (2013.01); *C09D 11/10* (2013.01);
(Continued)

(58) Field of Classification Search
None
See application file for complete search history.

(56) References Cited

U.S. PATENT DOCUMENTS 4,559,279 A * 12/1985 Honjo .................. H01G 4/0085
428/632
2005/0236182 A1* 10/2005 Hayashi ................. H05K 3/108
174/262
(Continued)

FOREIGN PATENT DOCUMENTS

JP S57(1982)-501786 A 10/1982
JP S62-37112 8/1987
(Continued)

*Primary Examiner* — Seth Dumbris
(74) *Attorney, Agent, or Firm* — Drinker Biddle & Reath LLP

(57) ABSTRACT

The substrate for a printed circuit board according to an embodiment of the present invention includes a base film having insulating properties, and a metal layer stacked on at least one surface of the base film, in which the base film includes a portion where a transition metal in group 10 of the periodic table is present. The transition metal in group 10 is (Continued)

preferably nickel or palladium. The portion where the transition metal in group 10 is present preferably includes a region having an average thickness of 500 nm and extending from an interface with the metal layer.

5 Claims, 5 Drawing Sheets

(51) Int. Cl.
C23C 18/31 (2006.01)
C23C 18/18 (2006.01)
C23C 18/30 (2006.01)
H05K 3/02 (2006.01)
H05K 3/10 (2006.01)
H05K 3/46 (2006.01)
C23C 18/20 (2006.01)
B22F 7/06 (2006.01)
C09D 11/037 (2014.01)
C09D 11/10 (2014.01)
C09D 11/52 (2014.01)
C23C 18/32 (2006.01)
C23C 18/40 (2006.01)
C23C 18/42 (2006.01)
H05K 3/38 (2006.01)
C23C 18/16 (2006.01)
H05K 3/18 (2006.01)
B22F 1/00 (2006.01)
B22F 3/16 (2006.01)

(52) U.S. Cl.
CPC .......... *C09D 11/52* (2013.01); *C23C 18/1692* (2013.01); *C23C 18/1879* (2013.01); *C23C 18/208* (2013.01); *C23C 18/2033* (2013.01); *C23C 18/2086* (2013.01); *C23C 18/30* (2013.01); *C23C 18/31* (2013.01); *C23C 18/32* (2013.01); *C23C 18/405* (2013.01); *C23C 18/42* (2013.01); *H05K 1/097* (2013.01); *H05K 3/02* (2013.01); *H05K 3/022* (2013.01); *H05K 3/108* (2013.01); *H05K 3/381* (2013.01); *H05K 3/4661* (2013.01); *B22F 1/0018* (2013.01); *B22F 1/0059* (2013.01); *B22F 3/16* (2013.01); *B22F 2998/10* (2013.01); *B22F 2999/00* (2013.01); *C23C 18/1653* (2013.01); *H05K 3/18* (2013.01); *H05K 2201/032* (2013.01); *H05K 2203/0703* (2013.01); *H05K 2203/1105* (2013.01); *Y10T 428/12063* (2015.01); *Y10T 428/12875* (2015.01); *Y10T 428/12944* (2015.01)

(56) References Cited

U.S. PATENT DOCUMENTS

| | | | |
|---|---|---|---|
| 2007/0264451 A1* | 11/2007 | Yusa | C23C 18/1621 428/34.1 |
| 2008/0090095 A1* | 4/2008 | Nagata | C23C 14/20 428/626 |
| 2009/0178831 A1* | 7/2009 | Yokota | C23C 18/1603 174/257 |
| 2009/0286006 A1* | 11/2009 | Lin | C09D 11/38 427/553 |
| 2010/0189974 A1 | 7/2010 | Ochi et al. | |
| 2012/0031656 A1* | 2/2012 | Oka | C23C 28/00 174/257 |

FOREIGN PATENT DOCUMENTS

| | | |
|---|---|---|
| JP | 3570802 B2 | 9/2004 |
| JP | 2005-050965 A | 2/2005 |
| JP | 2006-253482 A | 9/2006 |
| JP | 2008-75146 A | 4/2008 |
| JP | 2008-231459 A | 10/2008 |
| WO | WO 82/01015 A1 | 4/1982 |
| WO | WO 2009/004774 A1 | 1/2009 |
| WO | WO 2010/122918 A1 | 10/2010 |

* cited by examiner

SUBSTRATE FOR PRINTED CIRCUIT BOARD, PRINTED CIRCUIT BOARD, AND METHOD FOR PRODUCING SUBSTRATE FOR PRINTED CIRCUIT BOARD

TECHNICAL FIELD

The present invention relates to a substrate for a printed circuit board, a printed circuit board, and a method for producing a substrate for a printed circuit board.

BACKGROUND ART

A substrate for a printed circuit board, the substrate including a metal layer stacked on a surface of an insulating base film composed of, for example, a resin, has been widely used, the substrate being to be formed into a printed circuit board by etching the metal layer to form a conductive pattern.

In recent years, with a trend toward miniaturization and higher performance of electronic appliances, there has been a demand for higher-density printed circuit boards. As a substrate for a printed circuit board that meets the demand for higher density, a substrate for a printed circuit board has been required to include a metal layer with smaller thickness.

Furthermore, a substrate for a printed circuit board, the substrate having high peel strength between a base film and a metal layer, has been required in order not to allow the metal layer to be peeled from the base film when a bending force is applied to the printed circuit board.

To deal with these demands, a substrate for a printed circuit board, the substrate including a thin copper layer stacked on a heat-resistant insulating base film without an adhesive layer, has been reported (see Japanese Patent No. 3570802). In the traditional substrate for a printed circuit board, the thin copper layer (first conductive layer) having a thickness of 0.25 to 0.30 µm is formed on each surface of the heat-resistant insulating base film by a sputtering method, and a thick copper layer (second conductive layer) is formed thereon by an electrolytic plating method.

CITATION LIST

Patent Literature

PTL 1: Japanese Patent No. 3570802

SUMMARY OF INVENTION

Technical Problem

The traditional substrate for a printed circuit board is a substrate that meets the demand for a high-density printed circuit in terms of a thin metal layer having high peel strength. In the traditional substrate for a printed circuit board, however, the first conductive layer is formed by a sputtering method in order to form the metal layer in close contact with the base film. Thus, vacuum equipment is required, leading to high costs of construction, maintenance, operations, and so forth of the equipment. Furthermore, the supply of the base film used, the formation of the metal layer, the storing of the base film, and so forth must all be performed in vacuum. The size of the substrate is limited in terms of equipment.

The present invention has been accomplished in light of the foregoing circumstances. It is an object of the present invention to provide a substrate for a printed circuit board, the substrate including a low-cost, sufficiently thin metal layer having high peel strength, a printed circuit board, and a method for producing a substrate for a printed circuit board.

Solution to Problem

According to an aspect of the present invention to solve the problems, a substrate for a printed circuit board includes a base film having insulating properties and a metal layer stacked on at least one surface of the base film, the base film including a portion where a transition metal in group 10 of the periodic table is present.

According to another aspect of the present invention to solve the problems, a printed circuit board includes a conductive pattern, in which the conductive pattern is formed by subjecting a metal layer of the substrate for a printed circuit board to a subtractive process or a semi-additive process.

According to another aspect of the present invention to solve the problems, a method for producing a substrate for a printed circuit board includes the steps of: forming a first conductive layer by applying a conductive ink containing metal particles to at least one surface of a base film having insulating properties and heating the conductive ink; forming a second conductive layer on a surface of the first conductive layer opposite a surface on which the base film lies by non-electrolytic plating with a plating solution containing a transition metal in group 10 of the periodic table; and dispersing the transition metal in group 10 into the base film.

Advantageous Effects of Invention

In a substrate for a printed circuit board, a printed circuit board, and a method for producing a substrate for a printed circuit board according to the present invention, a low-cost, sufficiently thin metal layer having high peel strength is provided.

DESCRIPTION OF EMBODIMENTS

Description of Embodiments of Invention

Figure 1:
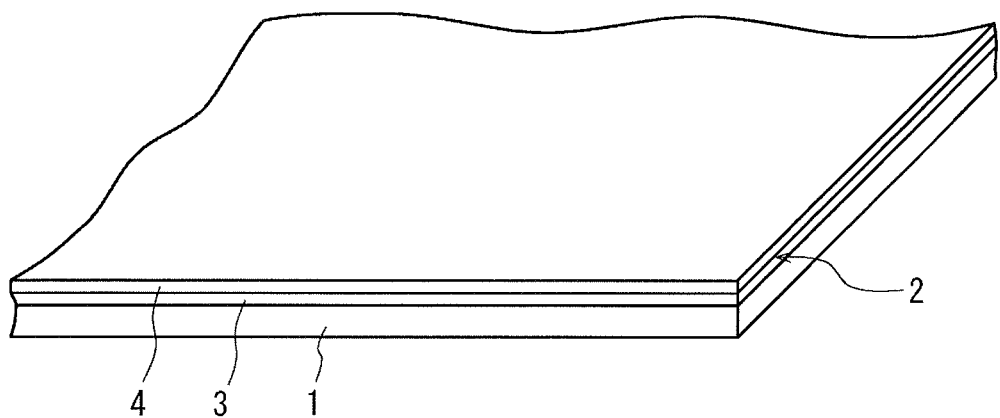
FIG. 1 is a schematic perspective view of a substrate for a printed circuit board according to an embodiment of the present invention.

A substrate for a printed circuit board according to an embodiment of the present invention includes a base film with insulating properties and a metal layer stacked on at least one surface of the base film, the base film including a portion where a transition metal in group 10 of the periodic table is present.

In the substrate for a printed circuit board, the base film includes the portion where the transition metal in group 10 of the periodic table is present. Thus, strong adhesion is obtained between the base film and the metal layer without using any adhesive layer, resulting in the high peel strength of the metal layer. The reason for this is not clear, but is presumably that the presence of the transition metal in group 10 of the periodic table reduces residual stresses in the base film and the metal layer to improve the adhesion between the base film and the metal layer. In the substrate for a printed circuit board, the base film is stacked on the metal layer without using any adhesive layer. Thus, the sufficiently thin metal layer is formed.

The transition metal in group 10 is preferably nickel or palladium. When the transition metal in group 10 is nickel or palladium, nickel or palladium, which is often contained in the metal layer, is also contained in the base film. This enhances an affinity between the base film and the metal layer to easily improve the peel strength of the metal layer, thus relatively easily promoting a thinner metal layer.

The portion where the transition metal in group 10 is present preferably includes a region having an average thickness of 500 nm and extending from an interface with the metal layer. When the portion where the transition metal in group 10 is present includes the region having an average thickness of 500 nm and extending from the interface with the metal layer, the peel strength of the metal layer from the base film is further reliably improved. This makes it possible to more easily form the metal layer having a smaller thickness.

Preferably, the transition metal in group 10 is present also in the metal layer, and the content of the transition metal in group 10 in the is higher than the content of the transition metal in group 10 in the metal layer. In the case where the transition metal in group 10 is present also in the metal layer and where the content of the transition metal in group 10 in the is higher than the content of the transition metal in group 10 in the metal layer, the residual stresses in the metal layer and the base film will be further reduced to further improve the adhesion between the base film and the metal layer, the residual stresses significantly affecting delamination between the metal layer and the base film.

Preferably, the content of the transition metal in group 10 in the region is quantitatively determined by EDX and found to be 1% or more by mass. When the content of the transition metal in group 10 in the region is the lower limit or more, improvement in the adhesion between the base film and the metal layer is further ensured. "EDX" used here is an acronym for energy dispersive X-ray spectrometry.

The metal layer preferably includes a first conductive layer formed by applying and baking a conductive ink containing metal particles, and a second conductive layer formed by non-electrolytic plating on a surface of the first conductive layer opposite a surface on which the base film lies. When the metal layer includes the first conductive layer formed by applying and baking a conductive ink containing metal particles, the second conductive layer is efficiently formed on the first conductive layer serving as an underlying layer without being limited to the material of the base film. Thus, the substrate for a printed circuit board including any of various base films is provided. When the metal layer includes the second conductive layer formed by non-electrolytic plating on a surface of the first conductive layer opposite a surface on which the base film lies, the metal layer accurately having a desired thickness is formed at relatively low costs. Furthermore, voids in the first conductive layer are filled therewith, thereby resulting in densification. This improves the conductivity of the metal layer and the adhesion of the metal layer to the base film.

A printed circuit board according to another aspect of the present invention is a printed circuit board including a conductive pattern, in which the conductive pattern is formed by subjecting the metal layer of the substrate for a printed circuit board to a subtractive process or a semi-additive process.

In the printed circuit board, the conductive pattern is formed by subjecting the metal layer of the substrate for a printed circuit board to a subtractive process or a semi-additive process. Thus, the conductive pattern is formed at low costs, has a small thickness, is fine, and is less likely to peel off from the base film.

A method for producing a substrate for a printed circuit board according to another aspect of the present invention includes the steps of: forming a first conductive layer by applying a conductive ink containing metal particles to at least one surface of a base film having insulating properties and heating the conductive ink, forming a second conductive layer on a surface of the first conductive layer opposite a surface on which the base film lies by non-electrolytic plating with a plating solution containing a transition metal in group 10 of the periodic table, and dispersing the transition metal in group 10 into the base film.

In the method for producing a substrate for a printed circuit board, the first conductive layer is formed by applying the conductive ink containing the metal particles to the at least one surface of the base film having insulating properties and heating the conductive ink, and the second conductive layer is formed on the surface of the first conductive layer opposite the surface on which the base film lies by non-electrolytic plating. Thus, there is no need for expensive vacuum equipment required for physical vapor deposition, such as sputtering. The size of the substrate for a printed circuit board produced by the method for producing a substrate for a printed circuit board is, therefore, not limited by vacuum equipment. In the method for producing a substrate for a printed circuit board, non-electrolytic plating is performed with the plating solution containing the transition metal in group 10 of the periodic table. Thus, a predetermined amount or more of the transition metal in group 10 of the periodic table is present in a near-interface layer in the first conductive layer and the base film, thereby improving the adhesion between the base film and the first conductive layer.

A substrate for a printed circuit board according to another aspect of the present invention includes a base film having insulating properties, a first conductive layer stacked by applying a conductive ink containing metal particles to at least one surface of the base film, and a second conductive layer stacked on a surface of the first conductive layer opposite a surface on which the base film lies by non-electrolytic plating, in which nickel is present in the first conductive layer, the second conductive layer, and the base film, and the nickel content of a near-interface layer extending from the interface between the first conductive layer and the base film to positions 500 nm or less from the interface is quantitatively determined by EDX and found to be 1% or more by mass.

In the substrate for a printed circuit board, the first conductive layer is stacked on the at least one surface of the base film by the application of the conductive ink containing the metal particles, and the second conductive layer is stacked by non-electrolytic plating on the surface of the first conductive layer opposite the surface on which the base film lies. Thus, there is no need for expensive vacuum equipment required for physical vapor deposition, such as sputtering. The size of the substrate for a printed circuit board is, therefore, not limited by vacuum equipment. In the substrate for a printed circuit board, a predetermined amount or more of nickel is present in the near-interface layer in the base film and the first conductive layer, thereby providing the strong adhesion between the base film and the first conductive layer without providing any adhesive layer. The reason for this is not clear, but is presumably that the presence of nickel reduces residual stresses in the base film and the first conductive layer to improve the adhesion between the base film and the first conductive layer. In the substrate for a printed circuit board, the base film is stacked on the first conductive layer without any adhesive layer. Thus, the sufficiently thin metal layer is formed. In the substrate for a printed circuit board, the first conductive layer is stacked on the at least one surface of the base film by the application of the conductive ink containing the metal particles. Thus, a substrate for a printed circuit board including any base film is provided without being limited to the material of the base film. A surface of the second conductive layer stacked by the non-electrolytic plating may be subjected to electrolytic plating. When the first conductive layer has an average thickness of less than 500 nm, the second conductive layer is not included in the near-interface layer.

The nickel content of the near-interface layer is preferably higher than the nickel content of an A layer extending from the interface between the first conductive layer and the second conductive layer to a position in the second conductive layer spaced from 500 nm or less from the interface. When the nickel content of the near-interface layer is higher than the nickel content of the A layer in the second conductive layer, residual stresses in the first conductive layer and the base film will be further reduced to further improve the adhesion between the base film and the first conductive layer, the residual stresses significantly affecting delamination between the first conductive layer and the base film. When the second conductive layer has an average thickness of 500 nm or less, the A layer indicates the entire second conductive layer.

When palladium is present in the first conductive layer, the second conductive layer, and the base film, the palladium content of a B layer extending from the interface between the base film and the first conductive layer to a position in the base film spaced 1 µm or less from the interface is preferably higher than the palladium content of the A layer extending from the interface between the first conductive layer and the second conductive layer to a position in the second conductive layer spaced 500 nm or less from the interface. When the palladium content of the B layer in the base film is higher than the palladium content of the A layer in the second conductive layer, denser deposition occurs at the interface between the base film and the first conductive layer during plating, thereby further improving the adhesion between the base film and the first conductive layer. When the base film has an average thickness of 1 µm or less, the B layer indicates the entire base film.

The non-electrolytic plating is preferably copper plating. When the non-electrolytic plating is performed by copper plating, the action of nickel incorporated into a copper plating solution results in the second conductive layer with a lower stress level.

The metal particles preferably have an average particle diameter of 1 nm or more and 500 nm or less. When the first conductive layer is stacked on the surface of the base film by the application of the conductive ink containing the metal particles having the average particle diameter within the range, the dense, uniform first conductive layer is stably formed on the base film having insulating properties. This enables the second conductive layer to be uniformly formed by non-electrolytic plating. The term "average particle diameter" used here indicates a particle diameter at 50% cumulative volume of a particle size distribution measured by a laser diffraction method. The average particle diameter may be measured with a MICROTRAC particle size distribution analyzer (Model UPA-150EX, manufactured by Nikkiso Co., Ltd).

The surface of the base film stacked on the first conductive layer is preferably subjected to hydrophilic treatment. When the surface of the base film stacked on the first conductive layer is subjected to hydrophilic treatment, the surface tension of the conductive ink against the base film is reduced. This facilitates uniform application of the conductive ink to the base film to easily form the first conductive layer with uniform thickness on the surface of the base film.

The metal is preferably copper. When the metal is copper, the first conductive layer is highly conductive, thus leading to the formation of a printed circuit board with good conductivity.

A method for producing a substrate for a printed circuit board according to another aspect of the present invention includes the steps of: forming a first conductive layer by applying a conductive ink containing metal particles to at least one surface of a base film having insulating properties and heating the conductive ink, and forming a second conductive layer on a surface of the first conductive layer opposite a surface on which the base film lies by non-electrolytic plating with a plating solution containing nickel, in which nickel is present in the first conductive layer, the second conductive layer, and the base film, and the nickel content of a near-interface layer extending from the interface between the first conductive layer and the base film to positions 500 nm or less from the interface is quantitatively determined by EDX and found to be 1% or more by mass.

In the method for producing a substrate for a printed circuit board, the first conductive layer is formed by applying the conductive ink containing the metal particles to the at least one surface of the base film and heating the conductive ink, and the second conductive layer is formed by non-electrolytic plating on the surface of the first conductive layer opposite the surface on which the base film is lies. Thus, there is no need for expensive vacuum equipment required for physical vapor deposition, such as sputtering. The size of the substrate for a printed circuit board produced by the method for producing a substrate for a printed circuit board is, therefore, not limited by vacuum equipment. In the method for producing a substrate for a printed circuit board, the non-electrolytic plating is performed with the plating solution containing nickel. Thus, a predetermined amount or more of nickel is present in the near-interface layer in the first conductive layer and the base film, thereby improving the adhesion between the base film and the first conductive layer. The second conductive layer may be formed by performing the non-electrolytic plating and then electrolytic plating.

A substrate for a printed circuit board according to another aspect of the present invention includes a base film having insulating properties, and a metal layer stacked on at least one surface of the base film, in which the base film includes a dispersive portion where palladium is dispersively present in the base film.

In the substrate for a printed circuit board, the base film includes the dispersive portion where palladium is dispersively present in the base film. Thus, the adhesion of the base film to the metal layer is improved to increase the peel strength of the metal layer. In the substrate for a printed circuit board, the adhesion is improved by dispersing palladium as described above. Thus, there is no need for vacuum equipment or the like for the production of the substrate, thereby inexpensively providing the substrate. The phrase "palladium is dispersively present" used here indicates that a perfect circle drawn in a region where palladium is not detected at a significant level by quantification using EDX, preferably, in a region having a palladium content less than 1% by mass, has a diameter of 20 nm or less. That is, palladium is preferably present in such a manner that the palladium content of a dispersive portion 3 in a base film 1 is quantitatively determined by EDX and found to be 1% or more by mass.

Palladium is preferably present in such a manner that the palladium content of the dispersive portion is quantitatively determined by EDX and found to be 1% or more by mass. When palladium is present in such a manner that the palladium content of the dispersive portion is quantitatively determined by EDX and found to be 1% or more by mass, the effect of improving the adhesion of the base film to the metal layer is more reliably provided.

The dispersive portion preferably includes a region extending from the interface with the metal layer to a position 500 nm or more, on average, from the interface. When the dispersive portion includes the region extending from the interface with the metal layer to the position 500 nm or more, on average, from the interface, the adhesion at the interface between the base film and the metal layer is further improved.

The palladium content of the B layer extending from the interface between the base film and the metal layer to the position in the base film spaced 1 µm or less from the interface in the thickness direction is preferably higher than the palladium content of D layer extending from the interface between the metal layer and the base film to a position in the metal layer spaced 500 nm or less from the interface in the thickness direction. When the palladium content of the B layer extending from the interface between the base film and the metal layer to the position in the base film spaced 1 µm or less from the interface in the thickness direction is higher than the palladium content of the D layer extending from the interface between the metal layer and the base film to the position in the metal layer spaced 500 nm or less from the interface in the thickness direction, the effect of improving the adhesion of the base film to the metal layer is further ensured.

The ratio of the palladium content at a position in the base film spaced 500 nm from the interface between the base film and the metal layer in the thickness direction to the palladium content at a position in the base film spaced 1 µm from the interface is preferably 0.7 or more and 1.1 or less. When the ratio of the palladium content at the position in the base film spaced 500 nm from the interface between the base film and the metal layer in the thickness direction to the palladium content at the position in the base film spaced 1 µm from the interface is within the range, a sufficient dispersion of palladium in the base film is assured to further ensure the effect of improving the adhesion of the base film to the metal layer is further ensured.

The metal particles preferably have an average particle diameter of 1 nm or more and 500 nm or less. When the average particle diameter of the metal particles is within the range, a conductive thin film is formed on a surface of the base film, and gaps between the metal particles are reliably filled by plating.

Preferably, the metal layer further includes a third conductive layer formed by electrolytic plating on a surface of the second conductive layer opposite a surface on which the first conductive layer lies. When the metal layer further includes the third conductive layer formed by electrolytic plating on the surface of the second conductive layer opposite the surface on which the first conductive layer lies, the metal layer is easily thickened with high accuracy.

A method for producing a substrate for a printed circuit board according to another aspect of the present invention includes the steps of: applying a conductive ink containing metal particles to at least one surface of a base film having insulating properties and baking the conductive ink; after the application and baking of the conductive ink, subjecting the one surface to non-electrolytic plating with palladium serving as a catalyst; and after the non-electrolytic plating step, performing heat treatment, in which in the heat treatment step, palladium is dispersed.

The method for producing a substrate for a printed circuit board includes the step of applying and baking the conductive ink containing the metal particles, thereby easily forming a conductive thin film on the surface of the base film. Thus, a metal layer is easily formed on the conductive thin film serving as a base. The method for producing a substrate for a printed circuit board includes the step of performing the non-electrolytic plating with palladium serving as a catalyst, so that voids in a layer formed by baking the metal particles are filled with a metal to densify the metal layer, thereby strengthening the adhesion of the metal layer to the base film. The method for producing a substrate for a printed circuit board includes the heat treatment step of dispersing palladium, so that palladium that can reduce the adhesion is removed from between the base film and the metal layer, thereby producing a substrate for a printed circuit board having high peel strength between the base film and the metal layer. The method for producing a substrate for a printed circuit board does not require vacuum equipment, so that the substrate for a printed circuit board is produced at low costs.

DETAILS OF EMBODIMENTS OF THE PRESENT INVENTION

A substrate for a printed circuit board, a printed circuit board, and a method for producing a substrate for a printed circuit board according to embodiments of the present invention will be described below with reference to the drawings.

First Embodiment

Figure 2:
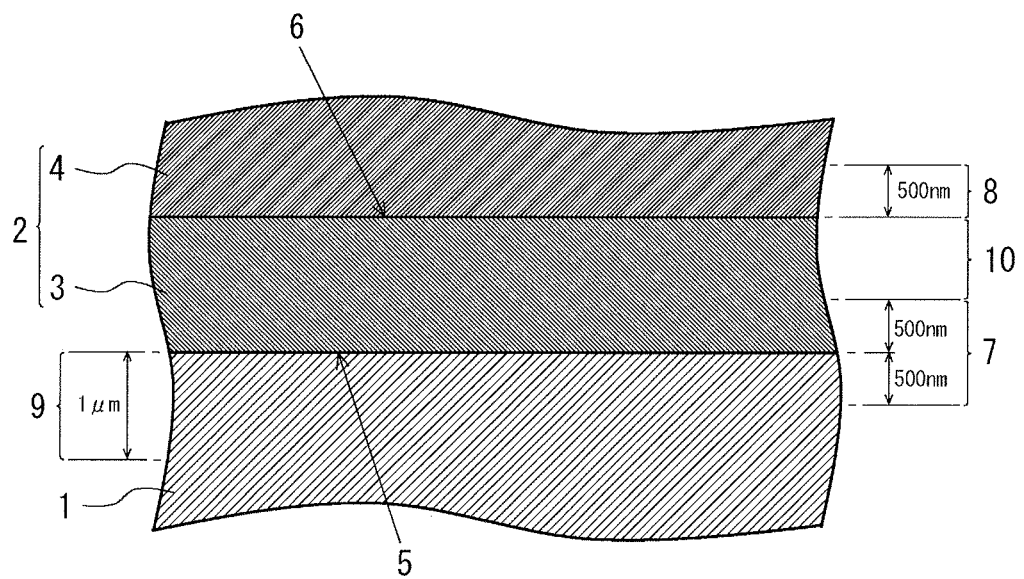
FIG. 2 is a schematic fragmentary cross-sectional view of the substrate for a printed circuit board illustrated in FIG. 1.

A substrate for a printed circuit board illustrated in FIGS. 1 and 2 includes a base film 1 having insulating properties, and a metal layer 2 stacked on at least one surface of the base film. The metal layer 2 includes a first conductive layer 3 stacked on the one surface of the base film 1 by applying a conductive ink containing metal particles, and a second conductive layer 4 stacked by non-electrolytic plating on a surface of the first conductive layer 3 opposite a surface on which the base film 1 lies. Nickel, which is one of metals in group 10 of the periodic table, is present in the first conductive layer 3, the second conductive layer 4, and the base film 1.

<Base Film>

The base film 1 included in the substrate for a printed circuit board has insulating properties. Examples of a material that may be used as the base film 1 include flexible resins, such as polyimide, liquid-crystal polymers, fluororesins, polyethylene terephthalate, and polyethylene naphthalate; rigid materials, such as phenolic paper, epoxy paper, glass composites, glass epoxy, Teflon (registered trademark), and glass substrates; and rigid-flexible materials in which hard materials and soft materials are combined together. Of these, polyimide is particularly preferred because of its bonding strength to a metal oxide or the like.

The thickness of the base film 1 is set, depending on a printed circuit board produced from the substrate for a printed circuit board, and is not particularly limited. For example, the lower limit of the average thickness of the base film 1 is preferably 5 µm and more preferably 12 µm. The upper limit of the average thickness of the base film 1 is preferably 2 mm and more preferably 1.6 mm. When the base film 1 has an average thickness less than the lower limit, the base film 1 can have insufficient strength. When the base film 1 has an average thickness more than the upper limit, it can be difficult to produce a printed circuit board having a smaller thickness.

A surface of the base film 1 to which the conductive ink is applied is preferably subjected to hydrophilic treatment. Examples of the hydrophilic treatment that may be employed include plasma treatment in which a surface is hydrophilized by plasma irradiation; and alkali treatment in which a surface is hydrophilized with an alkali solution. The hydrophilic treatment of the base film 1 reduces the surface tension of the conductive ink against the base film 1 to facilitate the uniform application of the conductive ink to the base film 1.

<First Conductive Layer>

The first conductive layer 3 is stacked on one surface of the base film 1 by the application of the conductive ink containing the metal particles. In the substrate for a printed circuit board, the first conductive layer 3 is formed by the application of the conductive ink, thus easily covering the one surface of the base film 1 with a conductive film. To remove unnecessary organic matter and so forth in the conductive ink and reliably fix the metal particles to the one surface of the base film 1, the first conductive layer 3 is preferably subjected to heat treatment after the application of the conductive ink.

(Conductive Ink)

The conductive ink used to form the first conductive layer 3 contains the metal particles serving as a conductive material that imparts conductivity. In this embodiment, as the conductive ink, a conductive ink containing metal particles, a dispersant that disperses the metal particles, and a dispersion medium is used. The first conductive layer 3 formed of fine metal particles is stacked on the one surface of the base film 1 by the application of such a conductive ink.

A metal constituting the metal particles in the conductive ink is not particularly limited. A metal such that a metal oxide derived from the metal, a group originating from the metal oxide, a metal hydroxide derived from the metal, or a group originating from the metal hydroxide is formed is preferred from the viewpoint of improving the adhesion between the first conductive layer 3 and the base film 1. For example, copper, nickel, aluminum, gold, or silver may be used. Of these, copper is preferably used because it is a highly conductive metal with good adhesion to the base film 1.

The lower limit of the average particle diameter of the metal particles in the conductive ink is preferably 1 nm and more preferably 30 nm. The upper limit of the average particle diameter of the metal particles is preferably 500 nm and more preferably 100 nm. When the average particle diameter of the metal particles is less than the lower limit, the dispersibility and stability of the metal particles in the conductive ink can be reduced. When the average particle diameter of the metal particles is more than the upper limit, the metal particles can be liable to precipitate out, and the uniform density of the metal particles is not easily obtained in applying the conductive ink.

The lower limit of the average thickness of the first conductive layer 3 is preferably 0.05 µm and more preferably 0.1 µm. The upper limit of the average thickness of the first conductive layer 3 is preferably 2 µm and more preferably 1.5 µm. When the average thickness of the first conductive layer 3 is less than the lower limit, portions where the metal particles are not present in the thickness direction can be increased to reduce the conductivity. When the average thickness of the first conductive layer 3 is more than the upper limit, it can be difficult to produce the metal layer having a smaller thickness.

<Second Conductive Layer>

The second conductive layer 4 is stacked by non-electrolytic plating on a surface of the first conductive layer 3 opposite a surface on which the base film 1 lies. Since the second conductive layer 4 is formed by the non-electrolytic plating, voids between the metal particles included in the first conductive layer 3 are filled with a metal in the second conductive layer 4. When a void is left in the first conductive layer 3, the void portion serves as a starting point of fracture to cause the first conductive layer 3 to be liable to be peeled from the base film 1. However, the void portion is filled with the second conductive layer 4, thus preventing the peeling off of the first conductive layer 3.

As a metal used for the non-electrolytic plating, for example, copper, nickel, or silver, which is highly conductive, may be used. When copper is used for the metal particles included in the first conductive layer 3, copper or nickel is preferably used in view of adhesion to the first conductive layer 3. In this embodiment, when a metal other than nickel is used for the non-electrolytic plating, a plating solution containing nickel or a nickel compound in addition to the plating metal is used as the plating solution used for the non-electrolytic plating.

The lower limit of the average thickness of the second conductive layer 4 formed by the non-electrolytic plating is preferably 0.2 μm and more preferably 0.3 μm. The upper limit of the average thickness of the second conductive layer 4 formed by the non-electrolytic plating is preferably 1 μm and more preferably 0.5 μm. When the average thickness of the second conductive layer 4 formed by the non-electrolytic plating is less than the lower limit, void portions of the first conductive layer 3 may not be sufficiently filled with the second conductive layer 4, thereby possibly reducing the conductivity. When the average thickness of the second conductive layer 4 formed by the non-electrolytic plating is more than the upper limit, the time required for the non-electrolytic plating can be prolonged to reduce productivity.

Preferably, the second conductive layer 4 having a larger thickness may be formed by, after the formation of a thin layer using the non-electrolytic plating, performing electrolytic plating. By performing the electrolytic plating after the non-electrolytic plating, the thickness of the metal layer is easily and accurately adjusted, and the metal layer having a thickness required for the formation of a printed circuit board is formed in a relatively short period of time. As a metal used for the electrolytic plating, for example, copper, nickel, or silver, which is highly conductive, may be used.

The thickness of the second conductive layer 4 after the electrolytic plating is set, depending on a printed circuit to be formed, and is not particularly limited. For example, the lower limit of the average thickness of the second conductive layer 4 after the electrolytic plating is preferably 1 μm and more preferably 2 μm. The upper limit of the average thickness of the second conductive layer 4 after the electrolytic plating is preferably 100 μm and more preferably 50 μm. When the average thickness of the second conductive layer 4 after the electrolytic plating is less than the lower limit, the metal layer can be susceptible to damage. When the average thickness of the second conductive layer 4 after the electrolytic plating is more than the upper limit, it can be difficult to produce a printed circuit board having a smaller thickness.

(Nickel Content)

Nickel aggregates in portions of the base film 1 and the first conductive layer 3 in the vicinity of the first interface 5. The nickel originates from nickel or a nickel compound in the plating solution used for the non-electrolytic plating and is one that has been precipitated in the vicinity of the first interface 5 during the non-electrolytic plating.

In the case where a region extending from the first interface 5 to a position in the first conductive layer 3 spaced 500 nm or less from the first interface 5 and to a position in the base film 1 spaced 500 nm or less from the first interface 5 is referred to as a near-interface layer 7, the lower limit of the nickel content of the near-interface layer 7 is 1% by mass and preferably 3% by mass, provided that the nickel content is quantitatively determined by EDX. The upper limit of the nickel content of the near-interface layer 7 is preferably 10% by mass and more preferably 8% by mass, provided that the nickel content is quantitatively determined by EDX. When the nickel content of the near-interface layer 7 is less than the lower limit, the effect of the presence of nickel on a reduction in residual stress is reduced, thus possibly failing to sufficiently improve the adhesion between the base film 1 and the first conductive layer 3. When the nickel content of the near-interface layer 7 is more than the upper limit, an increase in the nickel content of the plating solution or an increase in coating weight can cause the production cost of the substrate for a printed circuit board.

In the substrate for a printed circuit board, since nickel aggregates in the vicinity of the first interface 5, nickel is present in the vicinity of the first interface 5 in a larger amount than in the second conductive layer 4. Specifically, as illustrated in FIG. 2, when a region extending from a second interface 6 to a position in the second conductive layer 4 spaced 500 nm or less from the second interface 6 is referred to as an "A layer 8", the nickel content of the near-interface layer 7 is higher than the nickel content of the A layer 8. A large amount of nickel is present in the vicinity of the first interface 5, thus providing good adhesion between the base film 1 and the first conductive layer 3.

Nickel originating from nickel or a nickel compound in the plating solution used for the non-electrolytic plating precipitates out on the second conductive layer 4, the first conductive layer 3, and the base film 1 during the non-electrolytic plating and thus is present in the second conductive layer 4, the first conductive layer 3, and the base film 1.

In the substrate for a printed circuit board, nickel is present in the base film 1 in a larger amount than in the second conductive layer 4 because of the aggregation of nickel in the vicinity of the first interface 5. Specifically, as illustrated in FIG. 2, when a region extending from the first interface 5 to a position in the base film 1 spaced 1 μm or less from the first interface 5 is referred to as a "B layer 9", the nickel content of the B layer 9 is higher than the nickel content of the A layer 8. The presence of a large amount of nickel effectively reduces residual stress in the base film 1, the residual stress significantly affecting delamination between the first conductive layer and the base film, thereby improving the adhesion between the base film 1 and the first conductive layer 3.

The lower limit of the nickel content of the B layer 9 is preferably 1% by mass and more preferably 2% by mass, provided that the nickel content is quantitatively determined by EDX. The upper limit of the nickel content of the B layer 9 is preferably 5% by mass and more preferably 4% by mass, provided that the nickel content is quantitatively determined by EDX. When the nickel content of the B layer 9 is less than the lower limit, the residual stress in the base film 1 may not be sufficiently reduced, thereby possibly failing to sufficiently improve the adhesion between the base film 1 and the first conductive layer 3. When the nickel content of the B layer 9 is more than the upper limit, the nickel content of the near-interface layer 7 is relatively reduced. Thus, the residual stress in the near-interface layer 7 may not be sufficiently reduced, thereby possibly failing to sufficiently improve the adhesion between the base film 1 and the first conductive layer 3.

The lower limit of the nickel content of the A layer 8 is preferably 0.5% by mass and more preferably 1% by mass, provided that the nickel content is quantitatively determined by EDX. The upper limit of the nickel content of the A layer 8 is preferably 3% by mass and more preferably 2% by mass, provided that the nickel content is quantitatively determined by EDX. When the nickel content of the A layer 8 is less than the lower limit, the residual stress in the second conductive layer 4 may not be reduced to reduce the adhesion between the first conductive layer 3 and the second conductive layer 4. When the nickel content of the A layer 8 is more than the upper limit, an increase in the nickel content of the plating solution or an increase in coating weight can cause the production cost of the substrate for a printed circuit board.

As illustrated in FIG. 2, when a region of the first conductive layer 3 other than the near-interface layer 7 is referred to as a "C layer 10", the lower limit of the C layer 10 is preferably 1% by mass and more preferably 2% by mass, provided that the nickel content is quantitatively determined by EDX. The upper limit of the nickel content of the C layer 10 is preferably 6% by mass and more preferably 5% by mass, provided that the nickel content is quantitatively determined by EDX. When the nickel content of the C layer 10 is less than lower limit, the residual stress in the first conductive layer 3 may not be reduced to fail to sufficiently improve the adhesion between the base film 1 and the first conductive layer 3. When the nickel content of the C layer 10 is more than the upper limit, an increase in the nickel content of the plating solution or an increase in coating weight can cause the production cost of the substrate for a printed circuit board.

When palladium is used as a catalyst for the non-electrolytic plating, palladium is contained in the first conductive layer 3, the second conductive layer 4, and the base film 1, similar to the case of nickel. When palladium is contained, the palladium content of the B layer 9 is preferably higher than the palladium content of the A layer 8 and the palladium content of the C layer 10. By dispersing palladium in such a manner that the palladium content of the base film 1 is higher than the palladium contents of the first conductive layer 3 and the second conductive layer 4, denser deposition occurs at the interface between the base film 1 and the first conductive layer 3 during plating, thereby further improving the adhesion between the base film 1 and the first conductive layer 3. Palladium is not necessarily used as a catalyst for the non-electrolytic plating. When palladium is not used as a catalyst, palladium is not contained in the first conductive layer 3, the second conductive layer 4, and the base film 1 of the substrate for a printed circuit board.

[Method for Producing Substrate for Printed Circuit Board]

A method for producing the substrate for a printed circuit board includes a step of forming a first conductive layer by applying a conductive ink containing metal particles to one surface of a base film having insulating properties and heating the conductive ink (first conductive layer formation step), a step of forming a second conductive layer on a surface of the first conductive layer opposite a surface on which the base film lies by non-electrolytic plating with a plating solution containing a transition metal in group 10 of the periodic table (second conductive layer formation step), and a step of dispersing nickel, which is one of metals in group 10 of the periodic table, in the base film (nickel dispersion step).

In the substrate for a printed circuit board produced by the method for producing a substrate for a printed circuit board, nickel is present in the first conductive layer, the second conductive layer, and the base film. The nickel content of a near-interface layer extending from the interface between the first conductive layer and the base film to positions 500 nm or less from the interface is quantitatively determined by EDX and found to be 1% or more by mass.

<First Conductive Layer Formation Step>

Figure 3A:
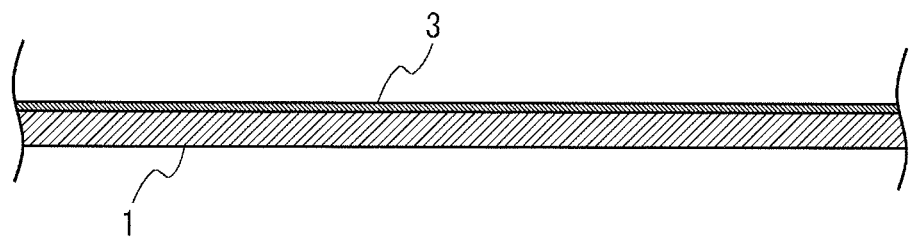
FIG. 3A is a schematic fragmentary cross-sectional view illustrating a method for producing the substrate for a printed circuit board illustrated in FIG. 1.

In the first conductive layer formation step, as illustrated in FIG. 3A, the conductive ink containing the metal particles is applied to a surface of the base film 1, dried, and then subjected to heat treatment.

(Method for Producing Metal Particles)

A method for producing metal particles to be dispersed in a conductive ink will be described. The metal particles may be produced by, for example, a high-temperature treatment method, a liquid-phase reduction method, or a gas-phase method.

To produce the metal particles by the liquid-phase reduction method, a method may be employed in which, for example, a water-soluble metal compound serving as a source of metal ions to be formed into metal particles and a dispersant are dissolved in water, a reductant is added thereto, and the metal ions are subjected to a reduction reaction for a certain period of time. In the liquid-phase reduction method, metal particles produced have a uniform spherical or granular form and a fine particle diameter. As the water-soluble metal compound serving as a source of metal ions, in the case of copper, for example, copper(II) nitrate ($Cu(NO_3)_2$) and copper(II) sulfate pentahydrate ($CuSO_4.5H_2O$) are exemplified. In the case of silver, for example, silver(I) nitrate ($AgNO_3$) and silver methanesulfonate ($CH_3SO_3Ag$) are exemplified. In the case of gold, hydrogen tetrachloroaurate(III) tetrahydrate ($HAuCl_4.4H_2O$) is exemplified. In the case of nickel, for example, nickel(II) chloride hexahydrate ($NiCl_2.6H_2O$) and nickel(II) nitrate hexahydrate ($Ni(NO_3)_2.6H_2O$) are exemplified. Regarding other metal particles, water-soluble compounds, such as chlorides, nitrate compounds, and sulfate compounds, may be used.

As the reductant used in producing metal particles by the liquid-phase reduction method, various reductants capable of reducing and precipitating metal ions in the reaction system of a liquid phase (aqueous solution) may be used. Examples of the reductant include sodium borohydride, sodium hypophosphite, hydrazine, transition metal ions, such as trivalent titanium ions and divalent cobalt ions, ascorbic acid, reducing sugars, such as glucose and fructose, and polyhydric alcohols, such as ethylene glycol and glycerol. A method in which metal ions are reduced to precipitate metal particles by redox reaction when, among the reductants, trivalent titanium ions are oxidized to tetravalent titanium ions is what is called a titanium redox method. Metal particles produced by the titanium redox method have a small, uniform particle diameter. In the titanium redox method, furthermore, the metal particles have a spherical or granular form. Thus, the use of the titanium redox method allows the metal particles to be more densely charged to form the denser first conductive layer 3.

The particle diameter of the metal particles may be adjusted by adjusting the types and mixing ratios of the metal compound, the dispersant, and the reductant and adjusting the stirring speed, the temperature, the time, the pH, and so forth when the metal compound is subjected to a reduction reaction. In this embodiment, in order to produce metal particles having a small particle diameter, for example, the pH of the reaction system is preferably 7 or more and 13 or less. At this time, the use of a pH modifying agent may adjust the pH of the reaction system to the range. Examples of the pH modifying agent that may be used include common acids and alkalis, such as hydrochloric acid, sulfuric acid, sodium hydroxide, and sodium carbonate. To particularly prevent the degradation of peripheral members, nitric acid and ammonia free from alkali metals, alkaline-earth metals, halogen elements, such as chlorine, and impurity elements, such as sulfur, phosphorus, and boron, are preferred.

(Preparation of Conductive Ink)

A method for preparing the conductive ink will be described below. As the dispersant in the conductive ink, any of various dispersants may be used as long as it has a molecular weight of 2,000 or more and 300,000 or less and is capable of satisfactorily dispersing metal particles precipitated in a dispersion medium. The use of the dispersant having a molecular weight within the range enables the metal particles to be satisfactorily dispersed in the dispersion medium, resulting in the dense, defect-free first conductive layer 3. When the dispersant has a molecular weight less than the lower limit, the effect of preventing the aggregation of the metal particles to maintain the dispersion may not be sufficiently provided, so that the first conductive layer 3 stacked on the base film 1 may not be dense and may not have few defects. When the dispersant has a molecular weight more than the upper limit, the dispersant is excessively bulky; hence, the dispersant can inhibit the sintering of the metal particles to form voids in the heat treatment after the application of the conductive ink. When the dispersant is excessively bulky, the density level of the first conductive layer 3 can be reduced, and the decomposition residues of the dispersant can reduce the conductivity.

Preferably, the dispersant does not contain sulfur, phosphorus, boron, halogens, or alkalis from the viewpoint of preventing the degradation of components. Preferred examples of the dispersant include amine-based polymer dispersants, such as polyethyleneimine and polyvinylpyrrolidone; hydrocarbon-based polymer dispersants each having a carboxylic acid group in its molecule, such as polyacrylic acid and carboxymethyl cellulose; and polymer dispersants each having a polar group, such as Poval (polyvinyl alcohol), styrene-maleic acid copolymers, olefin-maleic acid copolymers, and copolymers each having a polyethyleneimine moiety and a polyethylene oxide moiety in one molecule thereof, all of these dispersants each having a molecular weight within the range.

The dispersant may be added to the reaction system in the form of a solution in which the dispersant is dissolved in water or a water-soluble organic solvent. The dispersant content is preferably 1 part or more by mass and 60 parts or less by mass with respect to 100 parts by mass of the metal particles. The dispersant surrounds the metal particles to prevent aggregation of the metal particles, thus satisfactorily dispersing the metal particles. When the dispersant content is less than the lower limit, the effect of preventing the aggregation can be insufficient. When the dispersant content is more than the upper limit, in the heat treatment after the application of the conductive ink, an excessive amount of the dispersant can inhibit the baking including sintering of the metal particles to form voids, and decomposition residues of the polymer dispersant can be left as impurities in the first conductive layer 3 to reduce the conductivity.

The content of water serving as the dispersion medium in the conductive ink is preferably 20 parts or more by mass and 1900 parts or less by mass with respect to 100 parts by mass of the metal particles. Water serving as the dispersion medium sufficiently swells the dispersant to satisfactorily disperse the metal particles surrounded by the dispersant. When the content of water is less than the lower limit, the effect of water on the swelling of the dispersant can be insufficient. When the content of water is more than the upper limit, the proportion of the metal particles in the conductive ink is low, so that the satisfactory first conductive layer 3 having a necessary thickness and density may not be formed on the base film 1.

Regarding an organic solvent optionally mixed with the conductive ink, various water-soluble organic solvents may be used. Specific examples thereof include alcohols, such as methyl alcohol, ethyl alcohol, n-propyl alcohol, isopropyl alcohol, n-butyl alcohol, isobutyl alcohol, sec-butyl alcohol, and tert-butyl alcohol; ketones, such as acetone and methyl ethyl ketone; esters of a polyhydric alcohol, such as ethylene glycol or glycerin, or another compound; and glycol ethers, such as ethylene glycol monoethyl ether and diethylene glycol monobutyl ether.

The content of the water-soluble organic solvent is preferably 30 parts or more by mass and 900 parts or less by mass with respect to 100 parts by mass of the metal particles. When the content of the water-soluble organic solvent is less than the lower limit, the effect of the organic solvent on the adjustment of the viscosity and the vapor pressure of the dispersion may not be sufficiently provided. When the content of the water-soluble organic solvent is more than the upper limit, the effect of swelling the dispersant with water can be insufficient, thus possibly causing the aggregation of the metal particles in the conductive ink.

In the case of producing the metal particles by the liquid-phase reduction method, metal particles precipitated in a liquid-phase reaction system (aqueous solution) are subjected to steps of filtration, washing, drying, disintegration, and so forth into a powder. A conductive ink may be prepared with the powder. In this case, the powdery metal particles, water serving as a dispersion medium, a dispersant, and, optionally, a water-soluble organic solvent may be mixed together in predetermined proportions to prepare the conductive ink containing the metal particles. The conductive ink is preferably prepared with the liquid phase (aqueous solution) serving as a starting material. Specifically, the liquid phase (aqueous solution) of the containing the precipitated metal particles is subjected to treatment, for example, ultrafiltration, centrifugal separation, washing with water, or electrodialysis, for the removal of impurities and, optionally, concentration for the removal of water. Alternatively, water is added to the liquid phase to adjust the concentration of the metal particles, and, optionally, a water-soluble organic solvent is added in a predetermined proportion. Thereby, a conductive ink containing the metal particles is prepared. In this method, the formation of coarse, irregular particles due to aggregation of the metal particles during drying is prevented, thereby easily forming the dense, uniform first conductive layer 3.

(Application of Conductive Ink)

As a method for applying the conductive ink containing the metal particles dispersed therein to one surface of the base film 1, a known coating method, for example, a spin coating method, a spray coating method, a bar coating method, a die coating method, a slit coating method, a roll coating method, or a dip coating method, may be employed. The conductive ink may be applied to only part of one surface of the base film 1 by screen printing or with a dispenser or the like.

(Heat Treatment)

The conductive ink is applied to one surface of the base film 1, dried, and then subjected to heat treatment. By applying the conductive ink to the one surface of the base film 1 and then performing the heat treatment, the first conductive layer 3 fixed to the one surface of the base film 1 is formed as a baked coating layer. In the heat treatment, the dispersant and other organic substances in the applied conductive ink are evaporated and decomposed and thus removed from the coating layer. The remaining metal particles are in a sintered state or in a state in which the metal particles are in a stage prior to sintering and in close contact with each other to form a solid bond.

The metal particles are oxidized in a portion of the first conductive layer 3 in the vicinity of the first interface 5 between the first conductive layer 3 and the base film 1 by the heat treatment to form a metal oxide originating from the metal of the metal particles or a group originating from the metal oxide while the formation of a metal hydroxide originating from the metal or a group originating from the metal hydroxide is inhibited. Specifically, for example, when metal particles composed of copper are used, copper oxide and copper hydroxide are formed in a portion of the first conductive layer 3 in the vicinity of the interface between the first conductive layer 3 and the base film 1. The amount of copper oxide formed is larger than that of the copper hydroxide. Copper oxide formed in the vicinity of the first interface 5 is strongly bonded to polyimide contained in the base film 1, thus increasing the adhesion between the first conductive layer 3 and the base film 1.

The heat treatment is performed in an atmosphere containing a certain amount of oxygen. The lower limit of the oxygen concentration in the atmosphere during the heat treatment is 1 ppm and preferably 10 ppm. The upper limit of the oxygen concentration is 10,000 ppm and preferably 1,000 ppm. When the oxygen concentration is less than the lower limit, the amount of copper oxide formed in the portion of the first conductive layer 3 in the vicinity of the interface is small, so that the effect of copper oxide on improvement in the adhesion between the first conductive layer 3 and the base film 1 may not be sufficiently provided. When the oxygen concentration is more than upper limit, the metal particles can be excessively oxidized to reduce the conductivity of the first conductive layer 3.

The lower limit of the temperature of the heat treatment is preferably 150° C. and more preferably 200° C. The upper limit of the temperature of the heat treatment is preferably 500° C. and more preferably 400° C. When the temperature of the heat treatment is lower than the lower limit, the amount of the metal oxide formed in the portion of the first conductive layer 3 in the vicinity of the first interface 5 is small, so that the effect of the metal oxide on improvement in the adhesion between the first conductive layer 3 and the base film 1 may not be sufficiently provided. When the temperature of the heat treatment is higher than the upper limit, the base film 1 can deform when the base film 1 is composed of an organic resin such as polyimide.

<Second Conductive Layer Formation Step>

Figure 3B:
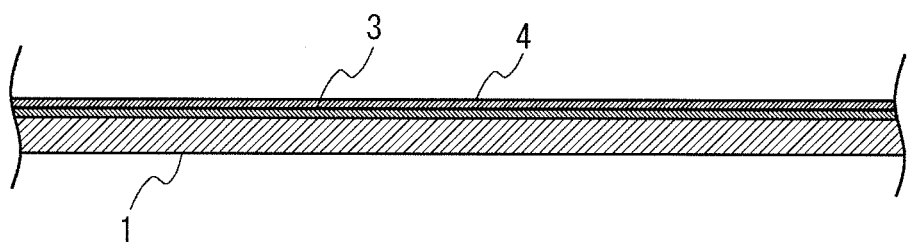
FIG. 3B is a schematic fragmentary cross-sectional view illustrating a step subsequent to a step illustrated in FIG. 3A in the method for producing the substrate for a printed circuit board illustrated in FIG. 1.

In the second conductive layer formation step, as illustrated in FIG. 3B, the second conductive layer 4 is formed on a surface of the first conductive layer 3 opposite a surface on which the base film 1 lies, the first conductive layer 3 having been stacked on the base film 1 in the first conductive layer formation step.

Regarding the non-electrolytic plating, the non-electrolytic plating is performed with treatment steps, such as a cleaner step, a water-washing step, an acid treatment step, a water-washing step, a pre-dip step, an activator step, a water-washing step, a reduction step, a water-washing step, a metal layer formation step (chemical copper step, chemical nickel step, and so forth), a water-washing step, and a drying step. Among these steps, the activator step is not an essential step and may not be necessarily performed.

As described above, for example, copper, nickel, or silver may be used as a metal used for the non-electrolytic plating. For example, when copper plating is performed, a copper plating solution containing a minute amount of nickel is used as a copper plating solution used for the non-electrolytic plating. The use of the copper plating solution containing nickel or a nickel compound leads to the formation of the second conductive layer 4 with low stress. As the copper plating solution, for example, a solution containing 0.1 mol or more and 60 mol or less nickel with respect to 100 mol of copper is used. Other components, such as a complexing agent, a reductant, and a pH modifying agent, may be appropriately added to the copper plating solution.

In the method for producing a substrate for a printed circuit board, by performing the non-electrolytic plating with the plating solution containing nickel or a nickel compound, nickel in the plating solution or nickel originating from the nickel compound precipitates out on the first conductive layer 3, the second conductive layer 4, and the base film 1 during the non-electrolytic plating. Nickel is distributed so as to aggregate in the near-interface layer 7. Thus, in the substrate for a printed circuit board, the residual stresses in the base film 1 and the first conductive layer 3 are reduced. In particular, the residual stress in the near-interface layer 7 is significantly reduced, thus significantly improving the adhesion between the first conductive layer 3 and the base film 1.

In the non-electrolytic plating, palladium may be used as a precipitation catalyst of a plating metal in the non-electrolytic plating. When palladium is used as a precipitation catalyst, for example, in the activator step, a surface of the first conductive layer 3 is brought into contact with a palladium chloride solution to allow palladium ions to adsorb on the surface of the first conductive layer 3. In the reduction step, the palladium ions adsorbed on the first conductive layer 3 are reduced to metallic palladium. For example, when non-electrolytic copper plating is performed, in the chemical copper step, the surface of the first conductive layer 3 is immersed in, for example, an aqueous solution containing copper sulfate and formalin to form a copper film on the surface of the first conductive layer 3 with palladium as a catalyst. For example, when non-electrolytic nickel plating is performed, in the chemical nickel step, the surface of the first conductive layer 3 is immersed in, for example, an aqueous solution containing nickel sulfate and sodium hypophosphite to form a nickel film on the surface of the first conductive layer 3 with palladium as a catalyst.

In the method for producing a substrate for a printed circuit board, when the non-electrolytic plating is performed with palladium as a precipitation catalyst, palladium formed by reducing the palladium ions absorbed on the first conductive layer 3 moves from the surface of the first conductive layer 3 toward the base film 1 during the non-electrolytic plating. Palladium that has been moved in this manner is distributed in such a manner that the palladium content of the base film 1 is higher than those of the first conductive layer 3 and second conductive layer 4. A large amount of palladium is contained in the base film 1. Thus, denser deposition occurs at the interface between the base film 1 and the first conductive layer 3 during plating, thereby further improving the adhesion between the base film 1 and the first conductive layer 3.

In the case where the metal layer is required to have an average thickness of, for example, 1 μm or more, after the non-electrolytic plating is performed, electrolytic plating is then performed until the thickness of the metal layer reaches the required thickness. The electrolytic plating may be performed with a known electrolytic plating bath corresponding to a plating metal, for example, copper, nickel, or silver, under appropriate conditions in such a manner that the metal layer having a predetermined thickness is rapidly formed without any defect.

<Nickel Dispersion Step>

In the nickel dispersion step, nickel in the metal layer 2 is dispersed in the base film 1. Nickel may be dispersed in the base film over time. The migration of nickel is preferably accelerated by heating. The nickel dispersion step may be performed simultaneously with the second conductive layer formation step. In the case where the conductive ink containing nickel is used in the first conductive layer formation step, the nickel dispersion step is simultaneously performed by heating in the first conductive layer formation step.

The phrase "nickel is dispersed" indicates that a perfect circle drawn in a region where nickel is not detected at a significant level by quantification using EDX, preferably, in a region having a nickel content less than 1% by mass, has a diameter of 20 nm or less. That is, the base film 1 preferably include a portion where the nickel content is quantitatively determined by EDX and found to be 1% or more by mass.

[Printed Circuit Board]

A printed circuit board is produced by forming a conductive pattern on the substrate for a printed circuit board illustrated in FIG. 1. The conductive pattern is formed by subjecting the first conductive layer 3 and the second conductive layer 4 of the substrate for a printed circuit board to a subtractive process or a semi-additive process.

[Method for Producing Printed Circuit Board]

An embodiment of a method for producing the printed circuit board with the substrate for a printed circuit board will be described below. Here, the case where a conductive pattern is formed by the subtractive process.

Figure 4A:
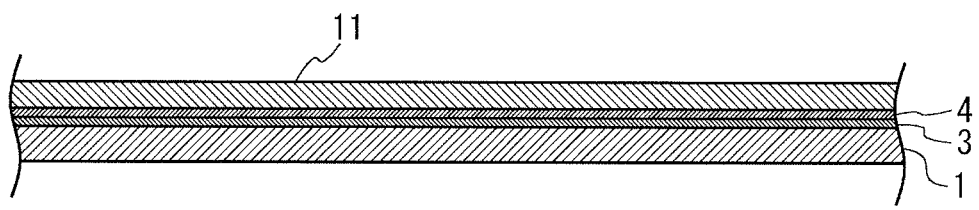
FIG. 4A is a schematic fragmentary cross-sectional view illustrating a method for producing a printed circuit board with the substrate for a printed circuit board illustrated in FIG. 1.
Figure 4B:
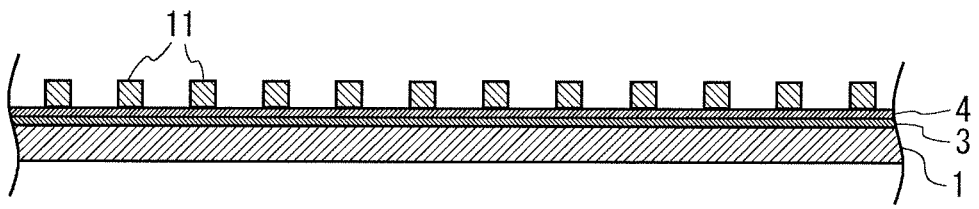
FIG. 4B is a schematic fragmentary cross-sectional view illustrating a step subsequent to a step illustrated in FIG. 4A in the method for producing a printed circuit board with the substrate for a printed circuit board illustrated in FIG. 1.
Figure 4C:
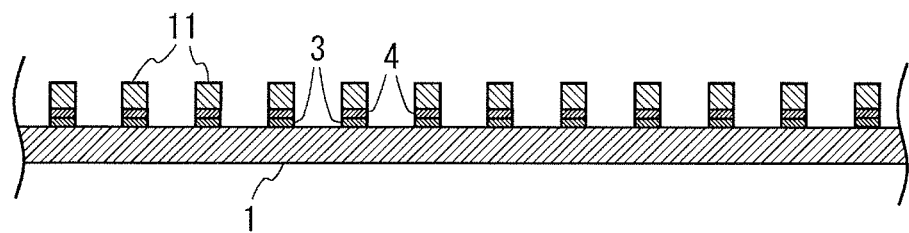
FIG. 4C is a schematic fragmentary cross-sectional view illustrating a step subsequent to the step illustrated in FIG. 4B in the method for producing a printed circuit board with the substrate for a printed circuit board illustrated in FIG. 1.
Figure 4D:
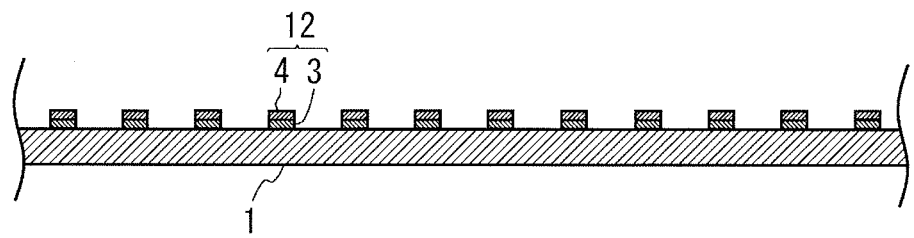
FIG. 4D is a schematic fragmentary cross-sectional view illustrating a step subsequent to the step illustrated in FIG. 4C in the method for producing a printed circuit board with the substrate for a printed circuit board illustrated in FIG. 1.

As illustrated in FIG. 4A, a photosensitive resist 11 is applied to one surface of the substrate for a printed circuit board, the substrate having been adjusted to have a predetermined size. As illustrated in FIG. 4B, a pattern corresponding to the conductive pattern is formed on the resist 11 by exposure, development, and so forth. As illustrated in FIG. 4C, portions of the second conductive layer 4 and the first conductive layer 3 other than the conductive pattern are removed by etching using the resist 11 as a mask. As illustrated in FIG. 4D, removal of the resist 11 left results in the printed circuit board including a conductive pattern 12 on the base film 1.

The method for producing a printed circuit board, the method including forming a circuit by the subtractive process, has been described above. Even if a circuit is formed by another known production method, such as the semi-additive process, the printed circuit board may be produced. The printed circuit board is produced using the substrate for a printed circuit board. Thus, the printed circuit board has a sufficiently small thickness that meets a demand for a high-density printed circuit. Furthermore, the adhesion between the base film 1 and the first conductive layer 3 is high, so that the metal layer is less likely to be peeled from the base film 1.

[Advantages]

In the substrate for a printed circuit board, a predetermined amount of nickel is present in the vicinity of the interface between the base film and the first conductive layer. Thus, the adhesion between the first conductive layer and the base film is high, so that the metal layer is less likely to be peeled from the base film.

In the substrate for a printed circuit board, the strong adhesion between the first conductive layer and the base film is obtained without using an adhesive. Thus, the adhesion between the metal layer and the base film is high, and a high-density printed circuit board is produced at low costs.

Second Embodiment

Figure 5:
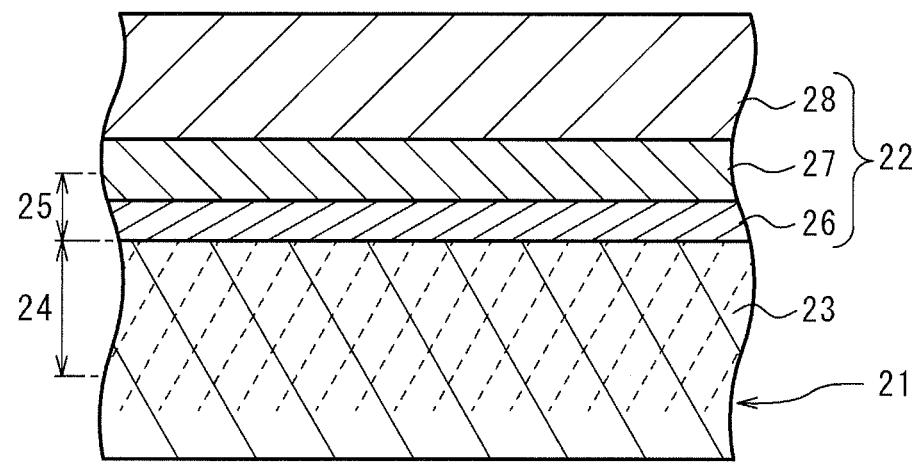
FIG. 5 is a schematic cross-sectional view of a substrate for a printed circuit board according to an embodiment different from that illustrated in FIG. 1.
Figure 6:
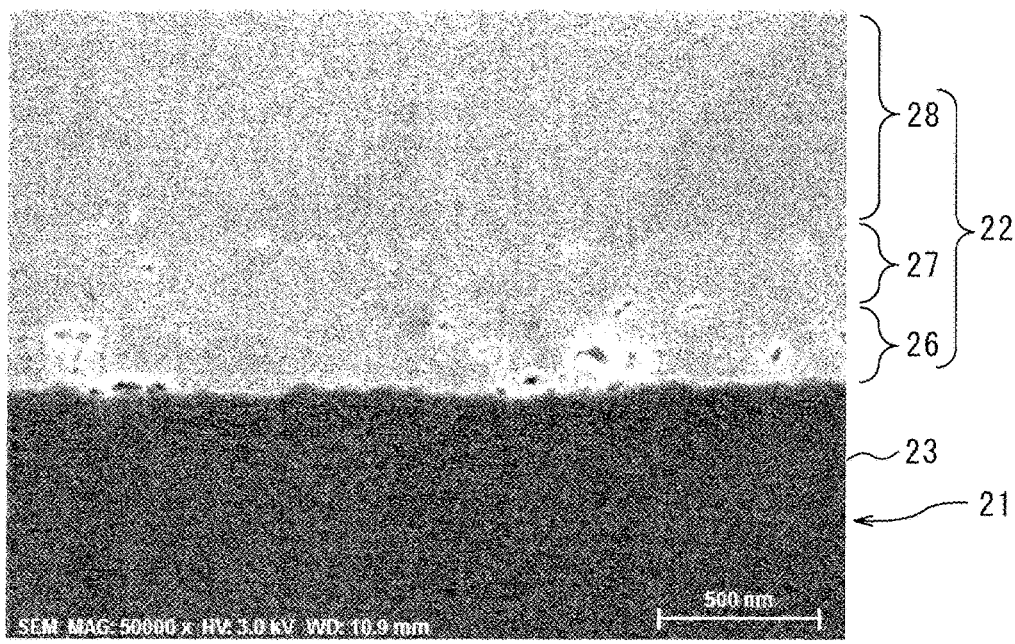
FIG. 6 is an example of an electron micrograph of a cross section of the substrate for a printed circuit board illustrated in FIG. 5.

A substrate for a printed circuit board illustrated in FIGS. 5 and 6 includes a base film 21 having insulating properties and a metal layer 22 stacked on at least one surface of the base film 21.

<Base Film>

The base film 21 is a sheet-like member serving as a base used in the substrate for a printed circuit board. The base film 21 functions as a member that supports a conductive pattern of a printed circuit board to be formed from the substrate for a printed circuit board.

Figure 7:
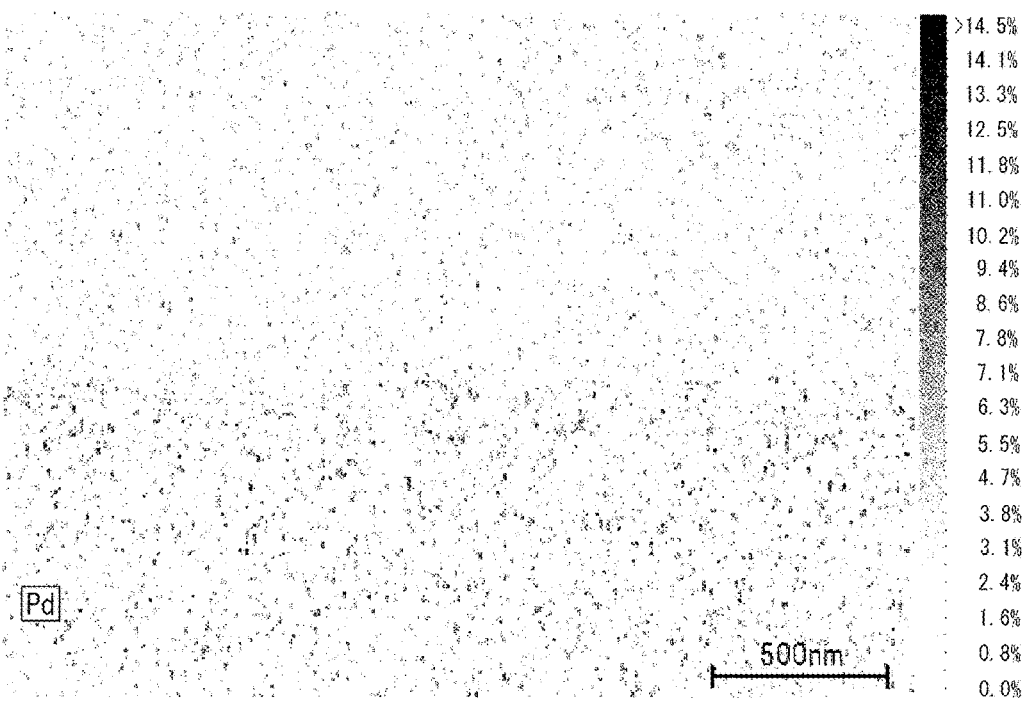
FIG. 7 is a map illustrating palladium content in the cross section of the substrate for a printed circuit board illustrated in FIG. 6.

The base film 21 includes a dispersive portion 23 where palladium, which is one of metals in group 10 of the periodic table, is dispersively present. FIG. 7 is a map illustrating palladium content in the same cross-sectional region as that in FIG. 6, the palladium content being quantitatively determined by EDX. The phrase "palladium is dispersively present" used here indicates that a perfect circle drawn in a region where palladium is not detected at a significant level by quantification using EDX, preferably, in a region having a palladium content less than 1% by mass, has a diameter of 20 nm or less. That is, palladium is preferably present in such a manner that the palladium content of a dispersive portion 23 in a base film 21 is quantitatively determined by EDX and found to be 1% or more by mass.

The material and thickness of the base film 21 of the substrate for a printed circuit board illustrated in FIGS. 5 and 6 may be the same as the material and thickness of the base film 1 of the substrate for a printed circuit board illustrated in FIGS. 1 and 2. As with the base film 1 of the substrate for a printed circuit board illustrated in FIGS. 1 and 2, regarding the base film 21 of the substrate for a printed circuit board illustrated in FIGS. 5 and 6, a surface of the base film 21 on which the metal layer 22 will be stacked is preferably subjected to hydrophilic treatment.

(Dispersive Portion)

The dispersive portion 23 is formed by introducing and dispersing palladium from a surface of the base film 21 toward the inside of the base film 21. Preferably, the dispersive portion 23 is formed by substantially uniformly introducing and dispersing palladium from the interface between the base film 21 and the metal layer 22 so as to extend from the interface between the metal layer 22 and the base film 21 in the thickness direction and occupy the whole or part of the base film 21 in the form of a layer having a substantially constant thickness. That is, the dispersive portion 23 preferably includes a region extending from the interface between the base film 21 and the metal layer 22 to a certain depth of the base film 21.

The lower limit of an average depth of the dispersive portion 23 from the interface between the metal layer 22 and the dispersive portion 23 is preferably 500 nm and more preferably 1 μm. The upper limit of the average depth of the dispersive portion 23 is preferably 100 μm and more preferably 10 μm. When the average depth of the dispersive portion 23 is less than the lower limit, the effect of the dispersion of palladium on improvement in the peel strength between the base film 21 and the metal layer 22 can be insufficient. When the average depth of the dispersive portion 23 is more than the upper limit, the cost of dispersing palladium, and by extension, the production cost of the substrate for a printed circuit board, can be unnecessarily increased.

The lower limit of the palladium content of a region 24 (hereinafter, referred to as a "B layer") extending from the interface between the metal layer 22 and the base film 21 to a position in the base film 21 spaced 1 μm or less from the interface in the thickness direction is preferably 3% by mass, more preferably 5% by mass, and still more preferably 10% by mass by quantification using EDX. The upper limit of the palladium content of the B layer 24 is preferably 40% by mass, more preferably 25% by mass, and still more preferably 15% by mass. When the palladium content of the B layer 24 is less than the lower limit, the effect of the dispersion of palladium on improvement in the peel strength between the base film 21 and the metal layer 22 can be insufficient. When the palladium content of the B layer 24 is more than upper limit, the base film 21 can have insufficient strength.

The palladium content of the B layer 24 is preferably higher than the palladium content of a region 25 (hereinafter, referred to as a "D layer") extending from the interface between the base film 21 and the metal layer 22 to a position in the metal layer 22 spaced 500 nm or less from the interface in the thickness direction. When the palladium content of the B layer 24 is less than the palladium content of the D layer 25, the effect of the dispersion of palladium on improvement in the peel strength between the base film 21 and the metal layer 22 can be insufficient.

The lower limit of the ratio of the palladium content at a position in the base film 21 spaced 500 nm from the interface between the base film 21 and the metal layer 22 in the thickness direction to the palladium content at a position in the base film 21 spaced 1 μm from the interface is preferably 0.7 and more preferably 0.8. The upper limit of the ratio of the palladium content is preferably 1.1 and more preferably 1. When the ratio of the palladium content is less than the lower limit, the gradient of the palladium content in the base film 21 is high, so that the effect of improving the peel strength between the base film 21 and the metal layer 22 can be insufficient. When the ratio of the palladium content is more than the upper limit, a large amount of palladium is dispersed in a deep portion of the base film, so that the production cost can be unnecessarily increased.

<Metal Layer>

The metal layer 22 includes a first conductive layer 26 formed by the application and baking of a conductive ink containing metal particles, a second conductive layer 27 formed by non-electrolytic plating on one surface of the first conductive layer 26 (the surface opposite a surface on which the base film 21 lies), and a third conductive layer 28 formed by electrolytic plating on a surface of the second conductive layer 27 (the surface opposite a surface on which the first conductive layer 26 lies).

The thickness of the metal layer 22 is determined, depending on a printed circuit to be formed from the substrate for a printed circuit board. The lower limit of the average thickness of the metal layer 22 is not particularly limited, and preferably 1 μm and more preferably 2 μm. The upper limit of the average thickness of the metal layer 22 is not particularly limited, and preferably 100 μm and more preferably 50 μm. When the average thickness of the metal layer 22 is less than the lower limit, the metal layer 22 can be susceptible to damage. When the average thickness of the metal layer 22 is more than the upper limit, it can be difficult to produce a printed circuit board having a smaller thickness.

The lower limit of the palladium content of the D layer 25 in the metal layer 22 is preferably 1% by mass, more preferably 3% by mass, and still more preferably 5% by mass, the palladium content being quantitatively determined by EDX. The upper limit of the palladium content of the D layer 25 is preferably 20% by mass, more preferably 15% by mass, and still more preferably 10% by mass. When the palladium content of the D layer 25 is less than the lower limit, the effect of the dispersion of palladium on improvement in the peel strength between the base film 21 and the metal layer 22 can be insufficient. When the palladium content of the D layer 25 is more than the upper limit, the base film 21 can have insufficient strength.

(First Conductive Layer)

The first conductive layer 26 is stacked on the one surface of the base film 21 by the application and baking of the conductive ink containing the metal particles. In the substrate for a printed circuit board, the first conductive layer 26 is formed by the application and baking of the conductive ink, thus easily covering the one surface of the base film 21 with a conductive film. To remove unnecessary organic matter and so forth in the conductive ink and reliably fix the metal particles to the one surface of the base film 21, the first conductive layer 26 is baked after the application of the conductive ink.

The conductive ink used to form the first conductive layer 26 of the substrate for a printed circuit board illustrated in FIGS. 5 and 6 may be the same as the conductive ink used to form the first conductive layer 3 of the substrate for a printed circuit board illustrated in FIGS. 1 and 2.

(Second Conductive Layer)

The second conductive layer 27 is stacked by non-electrolytic plating on the surface of the first conductive layer 26, in other words, the surface of the first conductive layer 26 opposite the surface on which the base film 21 lies. Since the second conductive layer 27 is formed by the non-electrolytic plating, voids between the metal particles included in the first conductive layer 26 are filled with a metal in the second conductive layer 27. When a void is left in the first conductive layer 26, the void portion serves as a starting point of fracture to cause the first conductive layer 26 to be liable to be peeled from the base film 21. However, the void portion is filled with the metal contained in the second conductive layer 27, thus preventing the peeling off of the first conductive layer 26.

As a metal used for the non-electrolytic plating, for example, copper, nickel, or silver, which is highly conductive, may be used. When copper is used for the metal particles included in the first conductive layer 26, copper or nickel is preferably used in view of adhesion to the first conductive layer 26. When a metal other than nickel is used for the non-electrolytic plating, a plating solution containing nickel or a nickel compound in addition to the plating metal is preferably used as the plating solution used for the non-electrolytic plating.

The average thickness of the second conductive layer 27 of the substrate for a printed circuit board illustrated in FIGS. 5 and 6 may be the same as the average thickness of the second conductive layer 4 of the substrate for a printed circuit board illustrated in FIGS. 1 and 2.

(Third Conductive Layer)

The third conductive layer 28 is formed by electrolytic plating so as to be stacked on the surface of the second conductive layer 27 formed by the non-electrolytic plating. By stacking the third conductive layer 28 formed by the electrolytic plating on the surface of the second conductive layer 27, the thickness of the metal layer 22 is easily and accurately adjusted, and the metal layer having a thickness required for the formation of a printed circuit board is formed in a relatively short period of time.

As a metal used for the electrolytic plating that is employed to form the third conductive layer 28, for example, copper, nickel, or silver, which is highly conductive, may be used.

The thickness of the third conductive layer 28 is determined, depending on the necessary thickness of the entire metal layer 22.

[Method for Producing Substrate for Printed Circuit Board]

Figure 8:
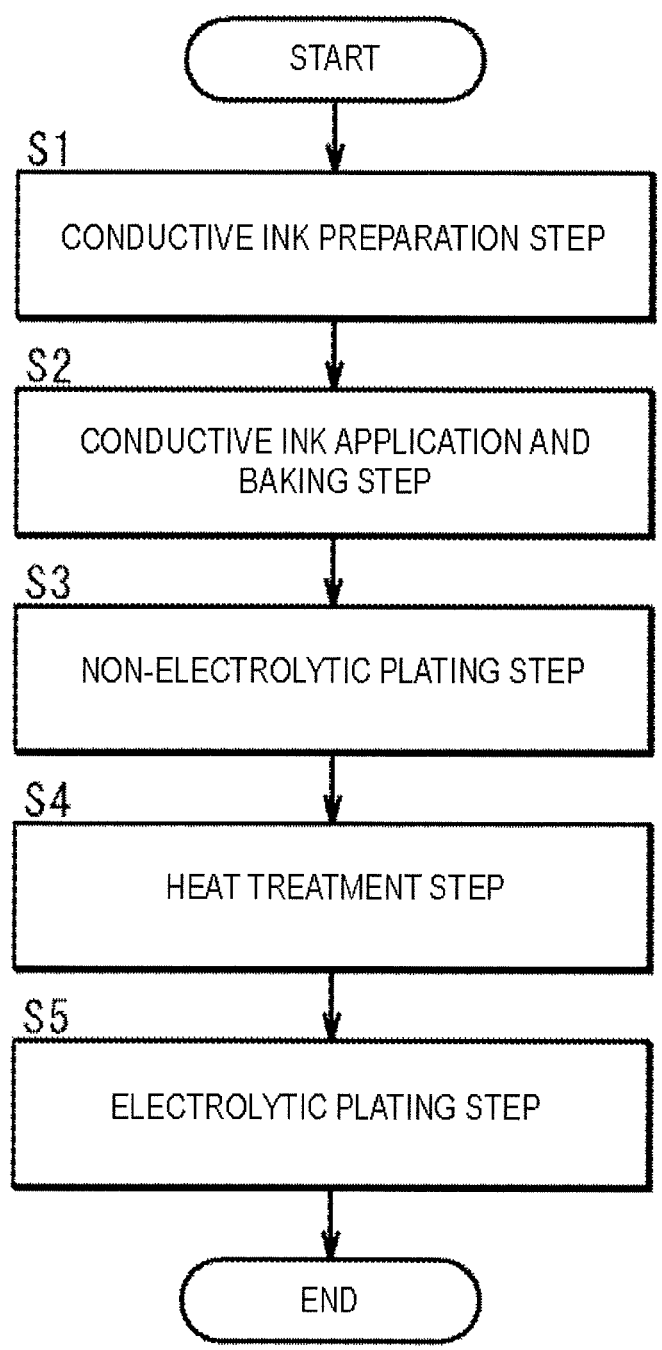
FIG. 8 is a flowchart illustrating a procedure for producing the substrate for a printed circuit board illustrated in FIG. 5.

A method for producing a substrate for a printed circuit board illustrated in FIG. 8 is a method for producing a substrate for a printed circuit board illustrated in FIG. 5.

The method for producing a substrate for a printed circuit board includes a step of preparing a conductive ink containing metal particles (step S1: conductive ink preparation step); a step of forming the first conductive layer 26 by applying the conductive ink to one surface of the base film 21 having insulating properties and baking the conductive ink (step S2: conductive ink application and baking step); after the first conductive layer formation step, a step of forming the second conductive layer by subjecting a surface of the first conductive layer 26 opposite a surface on which the base film lies to non-electrolytic plating with palladium serving as a catalyst to precipitate a metal on the surface of the first conductive layer 26 and in voids in the first conductive layer 26 (step S3: non-electrolytic plating step); after the non-electrolytic plating, a step of dispersing palladium in the base film 21 by heat treatment (step S4: heat treatment step); and after the heat treatment step, a step of forming the third conductive layer 28 by electrolytic plating on a surface of the second conductive layer 27 opposite a side on which the base film 21 lies (step S5: electrolytic plating step).

<Preparation Step>

In the preparation step, which is step S1, a dispersant is dissolved in a dispersion medium, and the metal particles are dispersed in the dispersion medium. The dispersant surrounds the metal particles to prevent aggregation of the metal particles, thus satisfactorily dispersing the metal particles in the dispersion medium. The dispersant may be added to the reaction system in the form of a solution in which the dispersant is dissolved in water or a water-soluble organic solvent.

<Conductive Ink Application and Baking Step>

In the conductive ink application and baking step, which is step S2, the conductive ink prepared in step S1 is applied to a surface of the base film 21, dried, and then baked by heating.

(Application of Conductive Ink)

As a method for applying the conductive ink containing the metal particles dispersed therein to one surface of the base film 21, a known coating method, for example, a spin coating method, a spray coating method, a bar coating method, a die coating method, a slit coating method, a roll coating method, or a dip coating method, may be employed. The conductive ink may be applied to only part of one surface of the base film 21 by screen printing or with a dispenser or the like.

Subsequently, the dispersion medium in the conductive ink applied to the base film 21 is evaporated to dry the conductive ink.

As a method for drying the conductive ink, for example, air drying, drying by heating, or drying with hot air, may be employed. However, in the method, air is not strongly blown on the conductive ink prior to drying to roughen a surface thereof.

By heating the dry conductive ink, the dispersion medium in the conductive ink is thermally decomposed simultaneously with the baking the metal particles, thereby forming the first conductive layer 26. By the baking, the metal particles are in a sintered state or in a state in which the metal particles are in a stage prior to sintering and in close contact with each other to form a solid bond. Thus, the first conductive layer 26 after the conductive ink application and baking step can include voids corresponding to gaps between the metal particles.

The baking is performed in an atmosphere containing a certain amount of oxygen. The lower limit of the oxygen concentration in the atmosphere during the baking is 1 ppm by volume and preferably 10 ppm by volume. The upper limit of the oxygen concentration is 10,000 ppm by volume and preferably 1,000 ppm by volume. When the oxygen concentration is less than the lower limit, the amount of a metal oxide formed in a portion of the first conductive layer 26 in the vicinity of the interface is small, so that the effect of the metal oxide on improvement in the adhesion between the first conductive layer 26 and the base film 21 may not be sufficiently provided. When the oxygen concentration is more than upper limit, the metal particles can be excessively oxidized to reduce the conductivity of the first conductive layer 26.

The lower limit of the temperature of the baking is preferably 150° C. and more preferably 200° C. The upper limit of the temperature of the baking is preferably 500° C. and more preferably 400° C. When the temperature of the baking is lower than the lower limit, the amount of the metal oxide formed in the portion of the first conductive layer 26 in the vicinity of the interface is small, so that the effect of the metal oxide on improvement in the adhesion between the first conductive layer 26 and the base film 21 may not be sufficiently provided. When the temperature of the baking is higher than the upper limit, the base film 21 can deform when the base film 21 is composed of an organic resin such as polyimide <Non-Electrolytic Plating Step>

In the non-electrolytic plating step, which is step S3, the first conductive layer 26 stacked on the base film 21 in the conductive ink application and baking step is subjected to the non-electrolytic plating with palladium serving as a catalyst, thereby forming the second conductive layer 27 on the surface of the first conductive layer 26 opposite the surface on which the base film 21 lies and precipitating a metal in the voids in the first conductive layer 26.

The non-electrolytic plating step includes a catalyst adsorption substep of allowing the first conductive layer 26 to adsorb palladium and a metal precipitation substep of precipitating a metal on a surface and in the inside of the first conductive layer 26 by immersing the stack of the first conductive layer 26 in a non-electrolytic plating solution. The non-electrolytic plating step may further include known substeps, such as a cleaning substep, a water-washing substep, an acid treatment substep, a water-washing substep, a reduction substep, and a drying substep, in addition to the catalyst adsorption substep and the metal precipitation substep.

(Catalyst Adsorption Substep)

In the catalyst adsorption substep, the first conductive layer 26 is brought into contact with a catalyst solution containing palladium to allow the first conductive layer 26 to adsorb palladium ions, and then the palladium ions are reduced to metallic palladium. The palladium concentration in the catalyst solution may be, for example, 20 ppm or more by mass to 1000 ppm or less by mass.

The lower limit of the temperature of the catalyst solution during immersion is preferably 30° C. and more preferably 40° C., depending on the immersion time. The upper limit of the temperature of the catalyst solution during the immersion is preferably 70° C. and more preferably 60° C. When the temperature of the catalyst solution during the immersion is lower than the lower limit, the adsorption of palladium can be insufficient. When the temperature of the catalyst solution during the immersion is higher than the upper limit, the amount of palladium adsorbed may not be easily controlled.

The lower limit of the immersion time in the catalyst solution is preferably 1 minute, more preferably 2 minutes, and still more preferably 3 minutes, depending on the temperature of the catalyst solution. The upper limit of the immersion time in the catalyst solution is preferably 10 minutes, more preferably 7 minutes, and still more preferably 5 minutes. When the immersion time in the catalyst solution is less than the lower limit, the adsorption of palladium can be insufficient. When the immersion time in the catalyst solution is more than the upper limit, the first conductive layer 26 may not be densified because of an excessively large amount of palladium adsorbed.

(Metal Precipitation Substep)

Examples of a metal precipitated in the metal precipitation substep include copper, nickel, and silver, as described above. For example, when copper is precipitated, a copper plating solution containing a minute amount of nickel is used as a copper plating solution used for the non-electrolytic plating. The use of the copper plating solution containing nickel or a nickel compound leads to the formation of the second conductive layer 27 with low stress. As the copper plating solution, for example, a solution containing 0.1 mol or more and 60 mol or less nickel with respect to 100 mol of copper is preferred. Other components, such as a complexing agent, a reductant, and a pH modifying agent, may be appropriately added to the copper plating solution.

In the non-electrolytic plating step, the first conductive layer 26 is densified by precipitating the metal on the surface of the first conductive layer 26 to form the second conductive layer 27 simultaneously with the precipitation of the metal in the voids in the first conductive layer 26. The densification of the first conductive layer 26 improves the conductivity of the first conductive layer 26 and increases the area of contact between the first conductive layer 26 and the base film 21 to increase the peel strength of the first conductive layer 26, and by extension, of the metal layer 22, from the base film 21.

<Heat Treatment Step>

In the heat treatment step, which is step S4, palladium present in a portion of the metal layer 22 in the vicinity of the interface between the metal layer 22 and the base film 21 is dispersed in the base film 21 by heat treatment.

The lower limit of the treatment temperature of the heat treatment step is preferably 150° C. and more preferably 200° C. The upper limit of the treatment temperature of the heat treatment step is preferably 500° C. and more preferably 400° C. When the treatment temperature in the heat treatment step is lower than the lower limit, palladium in the first conductive layer 26 may not be sufficiently dispersed in the base film 21. When the treatment temperature in the heat treatment step is higher than the upper limit, the base film 21 or the like can be damaged.

The lower limit of the heat treatment time in the heat treatment step is preferably 15 minutes and more preferably 30 minutes. The upper limit of the heat treatment time in the heat treatment step is preferably 720 minutes and more preferably 360 minutes. When the heat treatment time in the heat treatment step is less than the lower limit, palladium may not be sufficiently dispersed in the base film 21. When the heat treatment time in the heat treatment step is more than the upper limit, the production cost of the substrate for a printed circuit board can be unnecessarily increased.

<Electrolytic Plating Step>

In the electrolytic plating step, which is step S5, the third conductive layer 28 is formed by stacking a metal using the electrolytic plating on the surface of the second conductive layer 27 formed in the non-electrolytic plating step. In this step, the first conductive layer 26 is further densified by filling a metal into the voids left inside the first conductive layer 26 after the non-electrolytic plating step and into new voids formed by the dispersion of palladium in the base film in the heat treatment step, thereby further increasing the peel strength of the first conductive layer 26 from the base film 21. In other words, palladium, which is less likely to contribute to improvement in the adhesion of the metal layer 22 to the base film 21, is dispersed in the base film 21. The metal that contributes to improvement in adhesion is filled thereinto by the electrolytic plating instead. Thereby, the peel strength of the metal layer 22 is further increased. In the electrolytic plating step, the thickness of the metal layer 22 is easily and reliably increased to a desired thickness.

Regarding a specific method of the electrolytic plating in the electrolytic plating step, a known electrolytic plating method may be employed.

[Printed Circuit Board]

A printed circuit board is produced by forming a conductive pattern on the substrate for a printed circuit board illustrated in FIG. 1. The conductive pattern is formed by subjecting the metal layer 22 of the substrate for a printed circuit board to a subtractive process or a semi-additive process.

[Advantages]

In the substrate for a printed circuit board, the base film 21 includes the dispersive portion 23 where palladium is dispersively present. This improves the adhesion of the base film 21 to the metal layer 22 to increase the peel strength of the metal layer 22. Furthermore, in the substrate for a printed circuit board, the adhesion is improved by dispersing palladium, as described above. Thus, the production of the substrate for a printed circuit board does not require vacuum equipment or the like, so that the substrate for a printed circuit board is provided at low costs.

In the substrate for a printed circuit board, palladium is present in such a manner that the dispersive portion has a palladium content of 1% or more by mass, the palladium content being quantitatively determined by EDX. Thus, the effect of the presence of palladium in the base film 21, that is, the effect of improving the adhesion to metal layer 22, is further reliably provided.

In the printed circuit board, the conductive pattern is formed by subjecting the metal layer of the substrate for a printed circuit board to the subtractive process or the semi-additive process. Thus, the conductive pattern is fine and less likely to peel off from the base film.

The method for producing a substrate for a printed circuit board includes the step of applying and baking the conductive ink containing the metal particles. Thus, the first conductive layer 26 is easily formed on the surface of the base film 21. The method for producing a substrate for a printed circuit board includes the step of performing the non-electrolytic plating with palladium serving as a catalyst. Thus, the voids in the first conductive layer 26 are filled with the metal to densify the metal layer 22, thereby strengthening the adhesion of the metal layer 22 to the base film. Furthermore, the metal layer 22 is grown by stacking the second conductive layer 27. The method for producing a substrate for a printed circuit board includes the step of forming the third conductive layer by the electrolytic plating. Thus, the metal layer 22 is accurately grown at low costs so as to have a desired thickness. The method for producing a substrate for a printed circuit board includes the heat treatment step of dispersing palladium. Thus, palladium that can reduce the adhesion is removed from between the base film 21 and the metal layer 22, thereby resulting in high peel strength between the base film 21 and the metal layer 22.

Other Embodiments

The embodiments disclosed herein are to be considered in all respects as illustrative and not limiting. The scope of the invention is defined not by the configurations of the foregoing embodiments but by the following claims, and is intended to include any modifications within the scope and meaning equivalent to the scope of the claims.

In the foregoing embodiments, the metal layer including the first conductive layer and the second conductive layer is stacked on one surface of the base film 21. A substrate for a double-sided printed circuit board may be provided by the same method of formation, the substrate including a metal layer that includes a first conductive layer and a second conductive layer, the metal layer being stacked on each side of a base film. A metal layer having a different structure may be formed by another method on the other surface (a surface of the base film opposite the surface on which the metal layer lies) of the substrate for a printed circuit board produced in the foregoing embodiments. For example, metal foil may be bonded to the other surface of the substrate for a printed circuit board to form a metal layer.

The metal layer of the substrate for a printed circuit board has a two-layer structure or a three-layer structure including the first conductive layer and the second conductive layer. The metal layer may have a single-layer structure or a four-or-more-layer structure. Each of the conductive layers may be formed by a freely-selected method. For example, the base film may be directly subjected to non-electrolytic plating without the formation of a conductive layer by baking metal particles.

Examples

While the present invention will be described in more detail below by examples, the present invention is not limited to these examples.
<Test Nos. 1 to 6>

As examples, six types of substrates for printed circuit boards, the substrates being designated as Test Nos. 1 to 6 listed in Table 1, were produced with non-electrolytic plating solutions used for the formation of second conductive layers, the non-electrolytic plating solutions containing different nickel contents.

The substrate for a printed circuit board of Test No. 1 listed in Table 1 was produced as described below. Copper particles having an average particle diameter of 60 nm were dispersed in water serving as a medium to prepare a conductive ink having a copper concentration of 26% by mass. A polyimide film (Kapton "EN-S", available from Du Pont-Toray Co., Ltd.) having an average thickness of 25 μm was used as a base film having insulating properties. The conductive ink was applied to one surface of the polyimide film and dried in air atmosphere to form a first conductive layer having an average thickness of 0.15 μm. Heat treatment was performed for 30 minutes at 350° C. in a nitrogen atmosphere having an oxygen concentration of 100 ppm. One surface of the first conductive layer was subjected to non-electrolytic copper plating. Thereby, a second conductive layer having an average thickness of 0.4 μm was formed by the non-electrolytic plating. Here, a non-electrolytic copper plating solution containing 0.1 mol nickel with respect to 100 mol of copper was used for the non-electrolytic plating. Then electrolytic copper plating was performed to produce the substrate for a printed circuit board, the substrate including the metal layer composed of copper, the total thickness of the metal layer was 18 μm on average.

A substrate for a printed circuit board of Test No. 2 was produced in the same way as the substrate for a printed circuit board of Test No. 1, except that as the non-electrolytic copper plating solution, a non-electrolytic copper plating solution containing 1 mol nickel with respect to 100 mol of copper was used for the non-electrolytic plating. A substrate for a printed circuit board of Test No. 3 was produced in the same way as the substrate for a printed circuit board of Test No. 1, except that as the non-electrolytic copper plating solution, a non-electrolytic copper plating solution containing 20 mol nickel with respect to 100 mol of copper was used for the non-electrolytic plating. A substrate for a printed circuit board of Test No. 4 was produced in the same way as the substrate for a printed circuit board of Test No. 1, except that as the non-electrolytic copper plating solution, a non-electrolytic copper plating solution containing 60 mol nickel with respect to 100 mol of copper was used for the non-electrolytic plating.

A substrate for a printed circuit board of Test No. 5 was produced in the same way as the substrate for a printed circuit board of Test No. 3, except that an activator step was performed prior to the non-electrolytic plating, the polyimide film including the first conductive layer formed thereon was immersed in 0.3 g/L of palladium chloride at 45° C. for 30 seconds to precipitate metallic palladium on a surface of the first conductive layer, and then the non-electrolytic plating was performed. In the production of the substrates for printed circuit boards excluding Test No. 5, the activator step was not performed.

A substrate for a printed circuit board of Test No. 6 was produced in the same way as the substrate for a printed circuit board of Test No. 1, except that the non-electrolytic plating copper solution used for the non-electrolytic plating did not contain nickel.
<Evaluation of Adhesion>

For each of the substrates for printed circuit boards of Test Nos. 1 to 6, the peel strength (gf/cm) between the polyimide film and the metal layer was measured to evaluate the adhesion between the polyimide film and the metal layer. The measurement of the peel strength was performed according to JIS C6471 (1995), i.e., by a method of peeling the conductive layer from the polyimide film at a peel angle of 180° with respect to the polyimide film. Table 1 lists the measurement results of the peel strength.
<Measurement of Nickel Content and Palladium Content>

The cross section of each of the substrates for printed circuit boards of Test Nos. 1 to 6 was observed by EDX mapping with an energy dispersive X-ray spectrometer (a scanning electron microscope "SU8020", manufactured by Hitachi High-Technologies Corporation) at an accelerating voltage of 3 kV to measure the nickel content and the palladium content of the near-interface layer, the A layer, and the B layer. Table 1 lists the measurement results of the nickel content and the palladium content of each of the substrate for a printed circuit board.

TABLE 1

| Test No. | Peel strength (gf/cm) | Ni (near-interface layer) (% by mass) | Ni (A layer) (% by mass) | Pd (B layer) (% by mass) | Pd (A layer) (% by mass) |
|---|---|---|---|---|---|
| 1 | 780 | 3.2 | 0.4 | 0 | 0 |
| 2 | 800 | 3.6 | 1.0 | 0 | 0 |
| 3 | 800 | 4.8 | 1.6 | 0 | 0 |
| 4 | 840 | 4.2 | 2.2 | 0 | 0 |
| 5 | 800 | 4.6 | 2.2 | 8.2 | 1.8 |
| 6 | 120 | 0 | 0 | 0 | 0 |

[Evaluation Result]

The results listed in Table 1 indicate the following: Each of the substrates for printed circuit boards of Test Nos. 1 to 5 has a high peel strength of 700 gf/cm or more, which indicates a strong adhesion between the polyimide film and the metal layer. In contrast, the substrate for a printed circuit board of Test No. 6 has a low peel strength, which indicates that the metal layer is easily peeled off from the polyimide film.

In each of the substrate for a printed circuit board of Test Nos. 1 to 5, a large amount of Ni is present in the vicinity of the interface between the polyimide film and the metal layer. This presumably leads to the significantly higher adhesion between the polyimide film and the metal layer than that of the substrate for a printed circuit board of No. 6 in which no nickel is present in the vicinity of the interface. From the peel strength of the substrates for printed circuit boards of Test Nos. 1 to 4, a higher nickel content in the vicinity of the interface between the polyimide film and the metal layer results in further improvement in the adhesion between the polyimide film and the metal layer.

In the substrate for a printed circuit board of Test No. 5, palladium is present in the A layer and the B layer because the activator step has been performed. The results of Test Nos. 3 and 5 indicate that the effect of the presence of nickel on improvement in the adhesion between the polyimide film and the metal layer is provided even when palladium is present in the polyimide film.

<Test Nos. 7 to 14>

Nine types of experimental substrates for printed circuit boards of Test Nos. 7 to 14 were produced with catalyst solutions (activator solutions) having different palladium concentrations used in the non-electrolytic plating for the formation of the second conductive layer under different heat treatment conditions after the formation of the second conductive layer.

(Test No. 7)

The experimental substrate for a printed circuit board of Test No. 7 was produced. Copper particles having an average particle diameter of 60 nm were dispersed in water serving as a medium to prepare a conductive ink having a copper concentration of 26% by mass. A polyimide film (Kapton "EN-S", available from Du Pont-Toray Co., Ltd.) having an average thickness of 25 μm was used as a base film having insulating properties. The conductive ink was applied to one surface of the polyimide film, dried in air atmosphere, and heated in a nitrogen atmosphere having an oxygen concentration of 100 ppm by volume at 350° C. for 30 minutes to bake the copper particles in the conductive ink, thereby forming a first conductive layer having an average thickness of 0.15 μm. One surface of the first conductive layer was subjected to non-electrolytic copper plating. Thereby, a second conductive layer having an average thickness of 0.4 μm was formed by the non-electrolytic plating. In the non-electrolytic plating, a catalyst solution containing 50 ppm by mass palladium was used. Palladium was adsorbed on the first conductive layer by immersion at a solution temperature of 40° C. for 120 seconds. Here, a non-electrolytic copper plating solution containing 0.1 mol nickel with respect to 100 mol of copper was used for the non-electrolytic plating. After the non-electrolytic plating, heat treatment was performed at a heat treatment temperature of 350° C. for a treatment time of 120 minutes to disperse palladium in the base film. Then electrolytic copper plating was performed to form a third conductive layer, thereby producing the substrate for a printed circuit board of Test No. 7 in which the total thickness of the metal layer was 18 μm on average.

(Test Nos. 8 to 14)

Experimental substrates for printed circuit boards of Test Nos. 8 to 14 were produced under the same conditions as those in Test No. 7, except that different palladium concentrations in the catalyst solutions, different solution temperatures, and different immersion times during the immersion were used, as listed in Table 2. In Test No. 12, the catalyst solution was not used.

<Peel Strength>

For each of the substrates for printed circuit boards of Test Nos. 7 to 14, the peel strength between the polyimide film and the metal layer was measured according to JIS C6471 (1995), i.e., by a method of peeling the metal layer from the polyimide film at a peel angle of 180° with respect to the polyimide film. Table 2 lists the measurement results.

<Measurement of Palladium Content>

In the cross section of each of the substrates for printed circuit boards of Test Nos. 7 to 14, the palladium content of the B layer (a region of the base film extending from the interface to a position 1 μm from the interface) and the D layer (a region of the metal layer extending from the interface to a position 500 nm from the interface) was measured with an energy dispersive X-ray spectrometer (a scanning electron microscope "SU8020", manufactured by Hitachi High-Technologies Corporation) at an accelerating voltage of 6 kV. Table 2 lists the measurement results.

TABLE 2

| Test No. | Catalyst solution Pd concentration (ppm by mass) | Catalyst solution treatment time/ time/ temperature | Peel strength (N/cm) | B layer Pd content (% by mass) | D layer Pd content (% by mass) |
|---|---|---|---|---|---|
| 7 | 50 | 40° C./120 s | 8.1 | 5.1 | 1.9 |
| 8 | 80 | 45° C./60 s | 9.0 | 8.2 | 3.0 |
| 9 | 150 | 45° C./60 s | 9.2 | 15.3 | 5.6 |
| 10 | 250 | 45° C./120 s | 8.6 | 19.2 | 7.0 |
| 11 | 320 | 45° C./300 s | 8.8 | 24.6 | 9.0 |
| 12 | — | no | 2.0 | 0.0 | 0.0 |
| 13 | 320 | 25° C./60 s | 3.5 | 0.9 | 0.5 |
| 14 | 80 | 40° C./10 s | 3.2 | 0.8 | 0.4 |

[Evaluation Result]

From the results listed in Table 2, in the substrates for printed circuit boards of Test Nos. 7 to 11, palladium is sufficiently dispersed in the B layers, and the substrates have sufficient peel strength. In Test Nos. 12 to 14, the B layers have low palladium contents, and the peel strength is low. These results indicate that the peel strength of the metal layer is improved by dispersing palladium in the base film.

INDUSTRIAL APPLICABILITY

The substrate for a printed circuit board, the printed circuit board, and the method for producing a substrate for a printed circuit board according to the present invention are preferably used for printed circuit boards that meet the demand for high-density printed circuit boards because the metal layer is sufficiently reduced in thickness by increasing the peel strength of the metal layer at low costs.

REFERENCE SIGNS LIST 1, 21 base film
2, 22 metal layer
3, 26 first conductive layer
4, 27 second conductive layer
5 first interface (interface between base film and first conductive layer)
6 second interface (interface between first conductive layer and second conductive layer)
7 near-interface layer
8 A layer
9, 24 B layer
10 C layer
11 resist
12 conductive pattern
23 dispersive portion
25 D layer
28 third conductive layer
S1 conductive ink preparation step
S2 conductive ink application and baking step
S3 non-electrolytic plating step
S4 heat treatment step
S5 electrolytic plating step

The invention claimed is:

1. A substrate for a printed circuit board, comprising:
a base film having insulating properties; and
a metal layer stacked on at least one surface of the base film,
the base film including a portion where a transition metal in group 10 of the periodic table is present;
wherein the metal layer includes:
 a first conductive layer formed on the at least one surface of the base film by applying and baking a conductive ink containing metal particles, and
 a second conductive layer formed by non-electrolytic plating on a surface of the first conductive layer opposite a surface on which the base film lies;
the transition metal in group 10 comprises nickel;
a first interface is located between the base film and the first conductive layer; and
in a near-interface layer, which is a region extending from the first interface (i) to a position in the first conductive layer spaced 500 nm or less from the first interface and (ii) to a position in the base film spaced 500 nm or less from the first interface, a nickel content is from 1% by mass to 10% by mass, inclusive.

2. The substrate for a printed circuit board according to claim 1, wherein the transition metal in group 10 further comprises palladium.

3. The substrate for a printed circuit board according to claim 1, wherein the portion where the transition metal in group 10 is present includes a region having an average thickness of 500 nm and extending from an interface with the metal layer.

4. The substrate for a printed circuit board according to claim 3, wherein the transition metal in group 10 is present also in the metal layer, and
content of the transition metal in group 10 in the region is higher than content of the transition metal in group 10 in the metal layer.

5. A printed circuit board comprising a conductive pattern, wherein the conductive pattern is formed by subjecting the metal layer of the substrate for a printed circuit board according to claim 1 to a subtractive process or a semi-additive process.

* * * * *